United States Patent
Hirakawa et al.

(10) Patent No.: US 12,356,059 B2
(45) Date of Patent: *Jul. 8, 2025

(54) OPTICAL MEMBER, LENS DEVICE, AND IMAGING APPARATUS

(71) Applicant: FUJIFILM Corporation, Tokyo (JP)

(72) Inventors: Yuya Hirakawa, Saitama (JP); Kazuyoshi Okada, Saitama (JP); Yasunobu Kishine, Saitama (JP); Atsushi Kawanago, Saitama (JP)

(73) Assignee: FUJIFILM, Tokyo (JP)

( * ) Notice: Subject to any disclaimer, the term of this patent is extended or adjusted under 35 U.S.C. 154(b) by 89 days.

This patent is subject to a terminal disclaimer.

(21) Appl. No.: 18/301,245

(22) Filed: Apr. 16, 2023

(65) Prior Publication Data

US 2023/0319385 A1 Oct. 5, 2023

Related U.S. Application Data

(63) Continuation of application No. PCT/JP2021/039256, filed on Oct. 25, 2021.

(30) Foreign Application Priority Data

Oct. 30, 2020 (JP) .................. 2020-182465

(51) Int. Cl.
*H04N 23/55* (2023.01)
*G02B 5/20* (2006.01)
(Continued)

(52) U.S. Cl.
CPC ............. *H04N 23/55* (2023.01); *G02B 5/205* (2013.01); *G02B 5/3016* (2013.01); *H10F 39/8063* (2025.01)

(58) Field of Classification Search
CPC ........ H04N 23/55; H04N 23/00; G02B 5/205; G02B 5/3016; G02B 5/20; G02B 5/30;
(Continued)

(56) References Cited

U.S. PATENT DOCUMENTS

D250,338 S 11/1978 LaPierre
D278,359 S 4/1985 Sugimoto
(Continued)

FOREIGN PATENT DOCUMENTS

JP H0678938 11/1994
JP 2009284188 12/2009
(Continued)

OTHER PUBLICATIONS

"International Search Report (Form PCT/ISA/210) of PCT/JP2021/039256," mailed on Jan. 11, 2022, with English translation thereof, pp. 1-7.

(Continued)

*Primary Examiner* — Christopher K Peterson
(74) *Attorney, Agent, or Firm* — JCIPRNET

(57) ABSTRACT

An optical member includes aperture regions, a lens device, and an imaging apparatus. A lens device includes: an imaging optical system; a first polarizing part that polarizes at least a part of rays transmitted through the imaging optical system; and a filter unit that is disposed at a pupil position of the imaging optical system or near the pupil position, and includes aperture regions transmitting the rays of the imaging optical system and including a first aperture region and a second aperture region, wavelength selective filters disposed in the first aperture region and the second aperture region and transmitting pieces of light of which at least a part of wavelength ranges are different from each other, and a second polarizing filter including polarizing filters disposed in the first aperture region and the second aperture (Continued)

region and having polarization directions different from each other.

17 Claims, 28 Drawing Sheets

(51) Int. Cl.
  *G02B 5/30*   (2006.01)
  *H10F 39/00*   (2025.01)
(58) Field of Classification Search
  CPC ..... G02B 7/02; H01L 27/14627; G03B 11/00; G03B 17/14
  See application file for complete search history.

(56) References Cited

U.S. PATENT DOCUMENTS

| | | | |
|---|---|---|---|
| D307,153 S | 4/1990 | Martin | |
| D369,370 S | 4/1996 | Wray | |
| D527,070 S | 8/2006 | Venes | |
| D666,228 S | 8/2012 | Schneider | |
| D666,229 S | 8/2012 | Schneider | |
| D672,799 S | 12/2012 | Schneider | |
| D673,198 S | 12/2012 | Schneider | |
| D719,598 S | 12/2014 | Chang et al. | |
| 9,118,796 B2 | 8/2015 | Hiramoto et al. | |
| D741,448 S | 10/2015 | Hancock | |
| D776,737 S | 1/2017 | Horton et al. | |
| 9,661,193 B2 | 5/2017 | Narumi | |
| D836,423 S | 12/2018 | Kulik | |
| 10,264,953 B2 | 4/2019 | Kosugi et al. | |
| 11,726,389 B2 * | 8/2023 | Kawanago | G03B 33/16 |
| 2004/0240879 A1 | 12/2004 | Negishi et al. | |
| 2014/0055661 A1 | 2/2014 | Imamura et al. | |
| 2017/0195530 A1 | 7/2017 | Chen et al. | |
| 2018/0210223 A1 * | 7/2018 | Sharp | H04N 23/55 |
| 2018/0290479 A1 * | 10/2018 | Geday | G07D 7/12 |
| 2020/0117073 A1 | 4/2020 | Nakamura et al. | |
| 2021/0274070 A1 | 9/2021 | Ono | |
| 2021/0333151 A1 | 10/2021 | Miyata et al. | |
| 2023/0103720 A1 | 4/2023 | Kishine et al. | |

FOREIGN PATENT DOCUMENTS

| | | |
|---|---|---|
| JP | 2011081050 | 4/2011 |
| JP | 2012247645 | 12/2012 |
| JP | 2014003461 | 1/2014 |
| JP | 2015211430 | 11/2015 |
| JP | 2016036024 | 3/2016 |
| JP | 2016082325 | 5/2016 |
| JP | 2020051868 | 4/2020 |
| JP | 2020064164 | 4/2020 |
| JP | 7441313 | 2/2024 |
| WO | 2013114891 | 8/2013 |
| WO | 2014020791 | 2/2014 |
| WO | 2020110594 | 6/2020 |

OTHER PUBLICATIONS

"Written Opinion of the International Searching Authority (Form PCT/ISA/237) of PCT/JP2021/039256," mailed on Jan. 11, 2022, with English translation thereof, pp. 1-8.

"Office Action of co-pending U.S. Appl. No. 29/744,672", issued on Jun. 13, 2022, pp. 1-11.

"Japanese Office Action for Japanese Design Application No. 2020-014459", issued on Dec. 24, 2020, with English translation thereof, p. 1-p. 3.

"Japanese Office Action for Japanese Design Application No. 2020-018453", issued on Dec. 24, 2020, with English translation thereof, p. 1-p. 3.

Apiste Co., Ltd., "Infrared thermography FSV-7000E For All "Temperature Analysis professional" Real-time PC thermography ," Aug. 8, 2007, with English translation thereof, pp. 1-5.

"International Search Report (Form PCT/ISA/210) of PCT/JP2021/002356", mailed on Apr. 13, 2021, with English translation thereof, pp. 1-7.

"Written Opinion of the International Searching Authority (Form PCT/ISA/237) of PCT/JP2021/002356", mailed on Apr. 13, 2021, with English translation thereof, pp. 1-8.

"Office Action of Japan Counterpart Application", issued on May 19, 2025, with English translation thereof, p. 1-p. 12.

* cited by examiner

| ITEM | | B | G | R |
|---|---|---|---|---|
| (1) | HALOGEN LAMP | 40 | 100 | 140 |
| (2) | CHANGE IN AMOUNT OF LIGHT IN POLARIZING FILTER (POLARIZATION DIRECTION 4°) | 0.995134 | 0.312697 | 0.192169 |
| (3) | AMOUNT OF LIGHT IN CASE OF HALOGEN LAMP (POLARIZATION DIRECTION 4°) | 39.80536 | 31.26967 | 26.9037 |
| (4) | RATIO BETWEEN AMOUNTS OF LIGHT | 1.27297 | 1 | 0.860377 |
| (5) | LED | 140 | 100 | 30 |
| (6) | CHANGE IN AMOUNT OF LIGHT IN POLARIZING FILTER (POLARIZATION DIRECTION −63°) | 0.206107 | 0.296632 | 0.997261 |
| (7) | AMOUNT OF LIGHT IN CASE OF LED (POLARIZATION DIRECTION −63°) | 28.85503 | 29.66317 | 29.91783 |
| (8) | RATIO BETWEEN AMOUNTS OF LIGHT | 0.972756 | 1 | 1.008585 |

| ITEM | | B | G | R |
|---|---|---|---|---|
| (1) | (1) LED | 140 | 100 | 30 |
| (2) | HALOGEN LAMP | 40 | 100 | 140 |
| (3) | CHANGE IN AMOUNT OF LIGHT IN POLARIZING FILTER (POLARIZATION DIRECTION 0°) | 1 | 0.25 | 0.25 |
| (4) | (2) CHANGE IN AMOUNT OF LIGHT IN ND FILTER | 0.625 | 1 | 0.714286 |
| (5) | (1) × (2) | 87.5 | 100 | 21.42857 |
| (6) | (3) CHANGE IN AMOUNT OF LIGHT IN POLARIZING FILTER (POLARIZATION DIRECTION 121°) | 0.265264 | 0.23504 | 0.999695 |
| (7) | AMOUNT OF LIGHT IN CASE OF LED ((1) × (2) × (3)) | 23.21062 | 23.50404 | 21.42204 |
| (8) | RATIO BETWEEN AMOUNTS OF LIGHT | 0.987516 | 1 | 0.91142 |

| ITEM | | B | G | R |
|---|---|---|---|---|
| (1) | (1) HALOGEN LAMP | 40 | 100 | 140 |
| (2) | LED | 140 | 100 | 30 |
| (3) | CHANGE IN AMOUNT OF LIGHT IN POLARIZING FILTER (POLARIZATION DIRECTION 120°) | 0.25 | 0.25 | 1 |
| (4) | (2) CHANGE IN AMOUNT OF LIGHT IN ND FILTER | 0.714286 | 1 | 0.833333 |
| (5) | (1) × (2) | 28.57143 | 100 | 116.6667 |
| (6) | (3) CHANGE IN AMOUNT OF LIGHT IN POLARIZING FILTER (POLARIZATION DIRECTION 1°) | 0.999695 | 0.265264 | 0.23504 |
| (7) | AMOUNT OF LIGHT IN CASE OF HALOGEN LAMP ((1) × (2) × (3)) | 28.56273 | 26.52642 | 27.42138 |
| (8) | RATIO BETWEEN AMOUNTS OF LIGHT | 1.076765 | 1 | 1.033738 |

FIG. 16
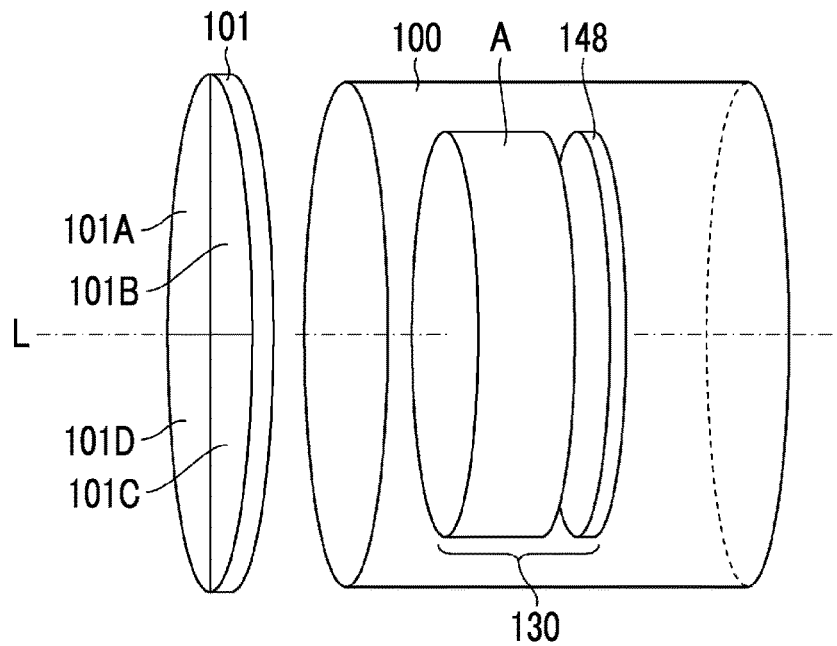
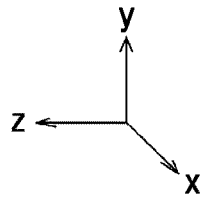
FIG. 17
| ITEM | | B | G | R |
|---|---|---|---|---|
| (1) | HALOGEN LAMP | 40 | 100 | 140 |
| (2) | CHANGE IN AMOUNT OF LIGHT IN POLARIZING FILTER (COUNTERCLOCKWISE 10°) | 0.895884 | 0.36042 | 0.263673 |
| (3) | AMOUNT OF LIGHT IN CASE OF HALOGEN LAMP (COUNTERCLOCKWISE 10°) | 35.83538 | 36.04196 | 36.91416 |
| (4) | RATIO BETWEEN AMOUNTS OF LIGHT | 0.994268 | 1 | 1.0242 |
| (5) | LED | 140 | 100 | 30 |
| (6) | CHANGE IN AMOUNT OF LIGHT IN POLARIZING FILTER (COUNTERCLOCKWISE 76°) | 0.193564 | 0.260993 | 0.856493 |
| (7) | AMOUNT OF LIGHT IN CASE OF LED (COUNTERCLOCKWISE 76°) | 27.09901 | 26.09925 | 25.69479 |
| (8) | RATIO BETWEEN AMOUNTS OF LIGHT | 1.038306 | 1 | 0.984503 |

| ITEM | | B | G | R |
|---|---|---|---|---|
| (1) | (1) LED | 140 | 100 | 30 |
| (2) | HALOGEN LAMP | 40 | 100 | 140 |
| (3) | CHANGE IN AMOUNT OF LIGHT IN POLARIZING FILTER (COUNTERCLOCKWISE 57°) | 0.395742 | 0.250463 | 0.218296 |
| (4) | (2) CHANGE IN AMOUNT OF LIGHT IN ND FILTER | 1 | 0.632017 | 0.517962 |
| (5) | (1) × (2) | 140 | 63.20166 | 15.53887 |
| (6) | (3) CHANGE IN AMOUNT OF LIGHT IN POLARIZING FILTER (COUNTERCLOCKWISE 169°) | 0.109914 | 0.238298 | 0.997001 |
| (7) | AMOUNT OF LIGHT IN CASE OF LED ((1) × (2) × (3)) | 15.38793 | 15.06083 | 15.49227 |
| (8) | RATIO BETWEEN AMOUNTS OF LIGHT | 1.021719 | 1 | 1.028647 |

| ITEM | | B | G | R |
|---|---|---|---|---|
| (1) | (1) HALOGEN LAMP | 40 | 100 | 140 |
| (2) | LED | 140 | 100 | 30 |
| (3) | CHANGE IN AMOUNT OF LIGHT IN POLARIZING FILTER (COUNTERCLOCKWISE 11°) | 0.147053 | 0.89386 | 0.982663 |
| (4) | (2) CHANGE IN AMOUNT OF LIGHT IN ND FILTER | 1 | 0.23032 | 0.698353 |
| (5) | (1) × (2) | 40 | 23.03198 | 97.76938 |
| (6) | (3) CHANGE IN AMOUNT OF LIGHT IN POLARIZING FILTER (COUNTERCLOCKWISE 132°) | 0.593104 | 0.984678 | 0.232259 |
| (7) | AMOUNT OF LIGHT IN CASE OF HALOGEN LAMP ((1) × (2) × (3)) | 23.72415 | 22.67908 | 22.70781 |
| (8) | RATIO BETWEEN AMOUNTS OF LIGHT | 1.046081 | 1 | 1.001267 |

FIG. 20

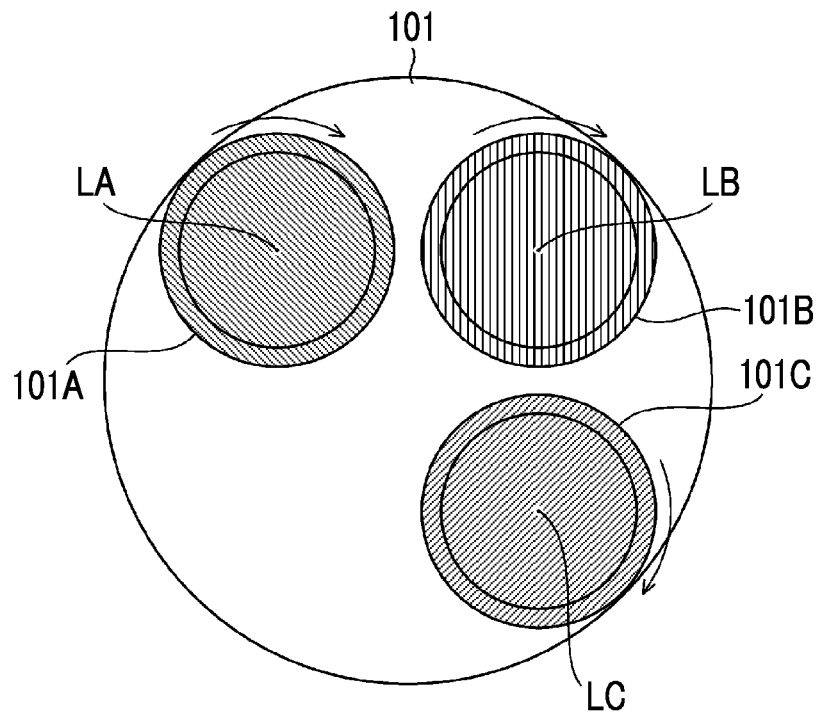

FIG. 21

| ITEM | | B | G | R |
|---|---|---|---|---|
| (1) | HALOGEN LAMP | 40 | 100 | 140 |
| (2) | CHANGE IN AMOUNT OF LIGHT IN POLARIZING FILTER (POLARIZATION DIRECTION 4°, 9°, -2°) | 0.995134 | 0.396044 | 0.280814 |
| (3) | AMOUNT OF LIGHT IN CASE OF HALOGEN LAMP (POLARIZATION DIRECTION 4°, 9°, -2°) | 39.80536 | 39.60442 | 39.31402 |
| (4) | RATIO BETWEEN AMOUNTS OF LIGHT | 1.005074 | 1 | 0.992668 |
| (5) | LED | 140 | 100 | 30 |
| (6) | CHANGE IN AMOUNT OF LIGHT IN POLARIZING FILTER (POLARIZATION DIRECTION -71°, -8°, -14°) | 0.105995 | 0.14033 | 0.48255 |
| (7) | AMOUNT OF LIGHT IN CASE OF LED (POLARIZATION DIRECTION -71°, -8°, -14°) | 14.83925 | 14.03301 | 14.47651 |
| (8) | RATIO BETWEEN AMOUNTS OF LIGHT | 1.057453 | 1 | 1.031604 |

OPTICAL MEMBER, LENS DEVICE, AND IMAGING APPARATUS

CROSS-REFERENCE TO RELATED APPLICATIONS

The present application is a Continuation of PCT International Application No. PCT/JP2021/039256 filed on Oct. 25, 2021 claiming priority under 35 U.S.C. § 119(a) to Japanese Patent Application No. 2020-182465 filed on Oct. 30, 2020. Each of the above applications is hereby expressly incorporated by reference, in its entirety, into the present application.

BACKGROUND OF THE INVENTION

1. Field of the Invention

The present invention relates to an optical member, a lens device, and an imaging apparatus, and more particularly, to an optical member comprising a plurality of aperture regions, a lens device, and an imaging apparatus.

2. Description of the Related Art

A technique for simultaneously acquiring a plurality of images having image information different from each other is known.

JP2015-211430A discloses a technique for simultaneously obtaining a plurality of images having different optical conditions. Crosstalk correcting processing for reducing the influence of crosstalk caused by an array-like optical element, such as a microlens array or a lenticular lens, is performed in the technique disclosed in JP2015-211430A.

SUMMARY OF THE INVENTION

An embodiment of a technique of the present disclosure provides an optical member including a plurality of aperture regions, a lens device, and an imaging apparatus.

A lens device according to an aspect of the present invention comprises: an imaging optical system; a first polarizing part that polarizes at least a part of rays transmitted through the imaging optical system; and a filter unit that is disposed closer to an image side than the first polarizing part, is disposed at a pupil position of the imaging optical system or near the pupil position, and includes a plurality of aperture regions transmitting the rays of the imaging optical system and including a first aperture region and a second aperture region, a plurality of wavelength selective filters disposed in the first aperture region and the second aperture region and transmitting pieces of light of which at least a part of wavelength ranges are different from each other, and a second polarizing filter including a plurality of polarizing filters disposed in the first aperture region and the second aperture region and having polarization directions different from each other.

Preferably, a polarization direction of the first polarizing part is variable.

Preferably, the first polarizing part is a first polarizing filter that is rotated about an optical axis.

Preferably, the first polarizing part is disposed on an object side of a lens included in the imaging optical system.

Preferably, the first polarizing part is disposed in the imaging optical system and is disposed closer to an object side than the filter unit.

Preferably, the first polarizing part includes a plurality of regions having polarization directions different from each other.

Preferably, the first polarizing part includes a plurality of regions of which polarization directions are changeable independently, and the plurality of regions are rotated about rotation axes, respectively.

Preferably, the second polarizing filter is disposed on an image side of the plurality of wavelength selective filters.

Preferably, the filter unit further includes a plurality of optical path length-correcting filters that are disposed in the first aperture region and the second aperture region and correct axial chromatic aberration caused by the plurality of wavelength selective filters.

Preferably, the filter unit further includes ND filters that are disposed in the first aperture region and the second aperture region and reduce an amount of rays of the imaging optical system.

Preferably, the first polarizing part is formed of a polarizing filter and a liquid crystal polarization-rotation element that is disposed on an image side of the polarizing filter.

Preferably, the lens device further comprises a polarization direction controller that controls the polarization direction of the first polarizing part, and the polarization direction controller controls the polarization direction of the first polarizing part on the basis of a ratio between an amount of light corresponding to the first aperture region and an amount of light corresponding to the second aperture region.

Preferably, the lens device further comprises a polarization direction restricting part that restricts the polarization direction of the first polarizing part at a predetermined position, and the polarization direction restricting part restricts the polarization direction of the first polarizing part on the basis of a ratio between an amount of light corresponding to the first aperture region and an amount of light corresponding to the second aperture region.

An optical member according to another aspect of the present invention is disposed at a pupil position of an imaging optical system or near the pupil position, and comprises a first polarizing filter that polarizes at least a part of rays transmitted through the imaging optical system, a plurality of aperture regions that transmit the rays of the imaging optical system and include a first aperture region and a second aperture region, a plurality of wavelength selective filters that are disposed in the first aperture region and the second aperture region and transmit pieces of light of which at least a part of wavelength ranges are different from each other, and a second polarizing filter that includes a plurality of polarizing filters disposed in the first aperture region and the second aperture region and having polarization directions different from each other. The first polarizing filter is disposed closest to an object side and the second polarizing filter is disposed closest to an image side.

An imaging apparatus according to another aspect of the present invention comprises the above-mentioned lens device or the above-mentioned optical member.

An optical member according to another aspect of the present invention is disposed at a pupil position of an imaging optical system or near the pupil position, and comprises a plurality of aperture regions that transmit rays of the imaging optical system and include a first aperture region and a second aperture region, ND filters that are disposed in the first aperture region and the second aperture region and reduce an amount of rays of the imaging optical system, a plurality of wavelength selective filters that are disposed in the first aperture region and the second aperture region and transmit pieces of light of which at least a part of wavelength ranges are different from each other, a plurality of optical path length-correcting filters that are disposed in the first aperture region and the second aperture region and correct axial chromatic aberration caused by the plurality of wavelength selective filters, and a plurality of polarizing filters that are disposed in the first aperture region and the second aperture region and have polarization directions different from each other. The optical path length-correcting filters are disposed closer to an image side than the wavelength selective filters.

An imaging apparatus according to another aspect of the present invention comprises the above-mentioned optical member, and a polarizing part that polarizes at least a part of rays transmitted through the imaging optical system.

BRIEF DESCRIPTION OF THE DRAWINGS

FIG. 14 is a table illustrating the adjustment of the amount of light.

FIG. 15 is a table illustrating the adjustment of the amount of light.

FIG. 16 is a diagram conceptually showing the first polarizing filter and the lens device.

FIG. 17 is a table illustrating the adjustment of the amount of light.

FIG. 18 is a table illustrating the adjustment of the amount of light.

FIG. 19 is a table illustrating the adjustment of the amount of light.

FIG. 20 is a diagram conceptually showing the first polarizing filter.

FIG. 21 is a table illustrating the adjustment of the amount of light.

DESCRIPTION OF THE PREFERRED EMBODIMENTS

An optical member, a lens device, and an imaging apparatus according to preferred embodiments of the present invention will be described below with reference to the accompanying drawings.

Figure 1:
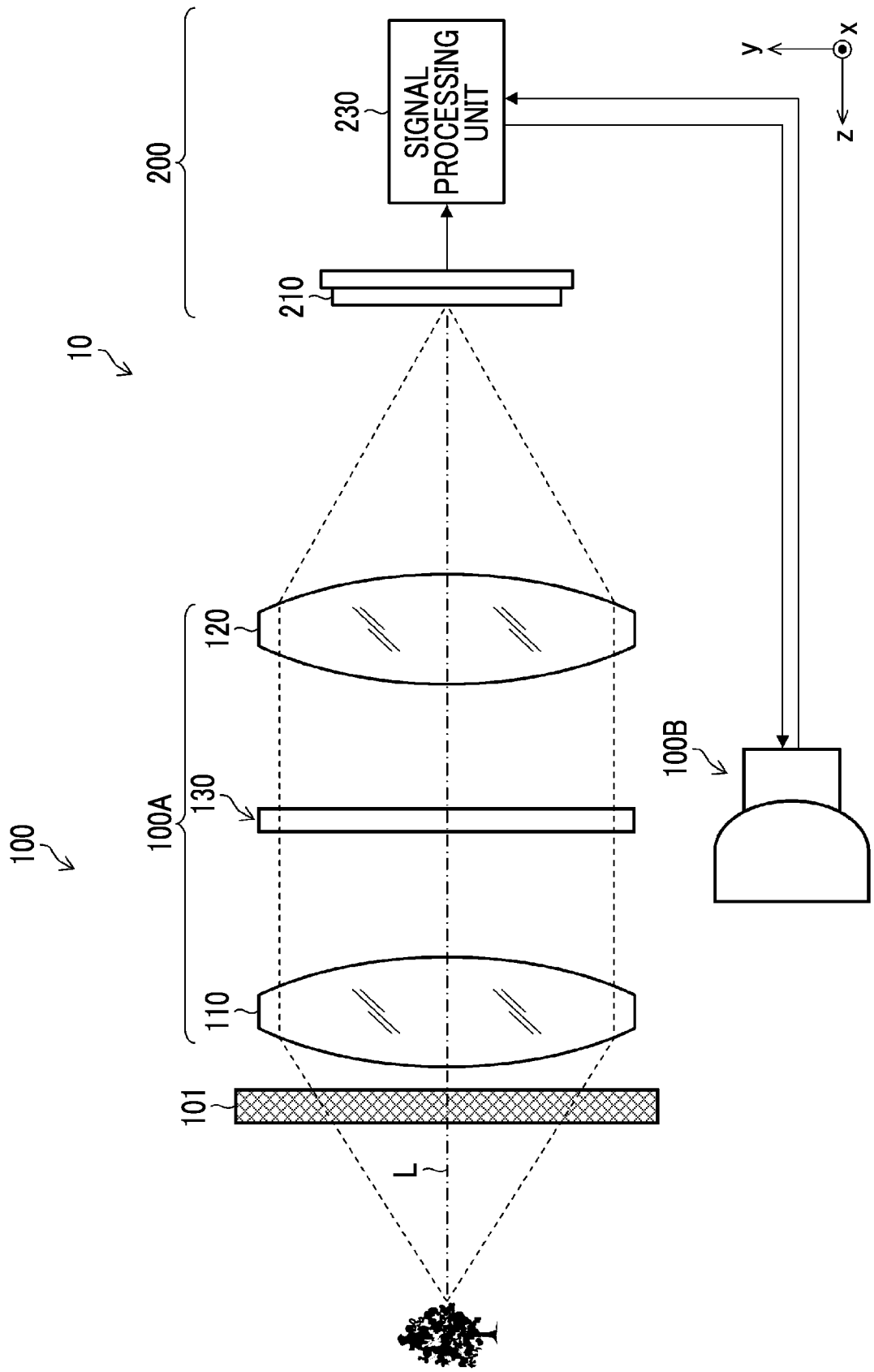
FIG. 1 is a diagram showing a schematic configuration of an imaging apparatus.

FIG. 1 is a diagram showing a schematic configuration of an imaging apparatus 10. The imaging apparatus 10 is a multispectral camera that captures a multispectral image. The imaging apparatus 10 comprises a lens device 100, an imaging apparatus body 200, and an illumination device 100B. The imaging apparatus body 200 comprises an imaging element 210 and a signal processing unit 230. The lens device 100 comprises a first polarizing filter 101 (first polarizing part) that is disposed on an object side, an imaging optical system 100A that is composed of a first lens 110 and a second lens 120, and a wavelength polarizing filter unit (a filter unit, an optical member) 130 that is disposed at a pupil position of the imaging optical system 100A or near the pupil position. Further, the imaging apparatus 10 comprises the illumination device 100B. The imaging apparatus 10 acquires a multispectral image of a subject that is illuminated by the illumination device 100B. In the following description, the object side is a positive side on a shown z axis and an image side is a negative side on the z axis.

Figure 2:
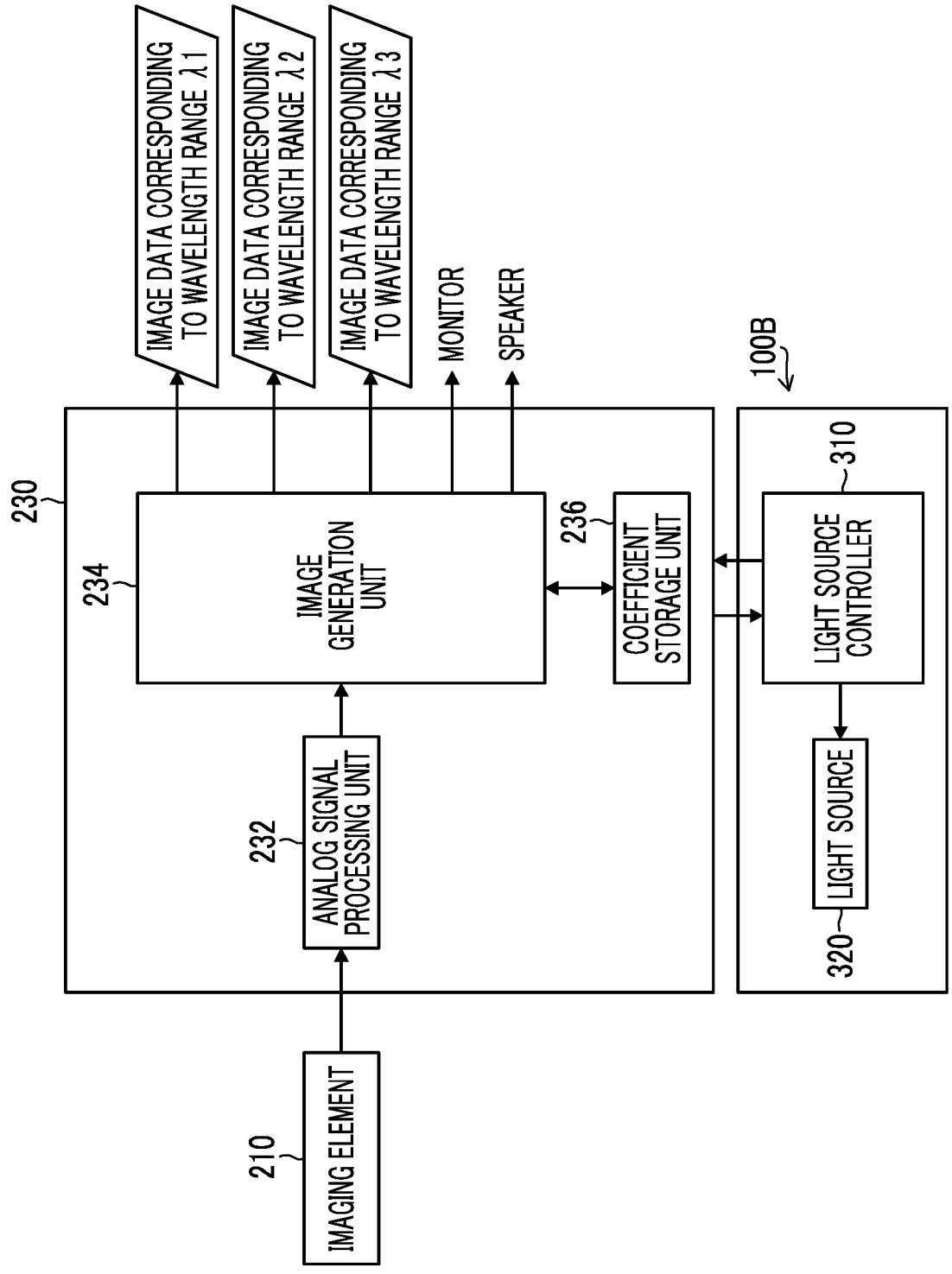
FIG. 2 is a diagram showing a configuration of a signal processing unit and an illumination device.

FIG. 2 is a diagram showing a configuration of the signal processing unit 230 and the illumination device 100B. The signal processing unit 230 comprises an analog signal processing unit 232 that performs analog signal processing on signals output from the imaging element 210, an image generation unit 234, and a coefficient storage unit 236. The image generation unit 234 (processor) comprises a non-transitory recording medium (not shown), such as a read only memory (ROM), in which computer readable codes of an imaging program to be executed by a computer are recorded, and a transitory storage region (not shown) for work; and generates a plurality of images (spectral images), which correspond to the wavelength ranges of a plurality of wavelength selective filters arranged in the imaging optical system 100A, respectively, on the basis of a plurality of image signals output from the imaging element 210. The image generation unit 234 can generate images (three-band multispectral images) that correspond to wavelength ranges $\lambda 1$, $\lambda 2$, and $\lambda 3$ corresponding to, for example, the wavelength selective filters.

The functions of the above-mentioned signal processing unit 230 can be realized using various processors and recording mediums. The various processors also include, for example, a central processing unit (CPU) that is a generalpurpose processor realizing various functions by executing software (program), a graphics processing unit (GPU) that is a processor specialized in image processing, and a programmable logic device (PLD) that is a processor of which circuit configuration can be changed after manufacture, such as a field programmable gate array (FPGA). Each function may be realized by one processor or may be realized by a plurality of processors of the same type or different types (for example, a plurality of FPGAs, a combination of a CPU and an FPGA, or a combination of a CPU and a GPU). Further, a plurality of functions may be realized by one processor. The hardware structures of these various processors are more specifically electrical circuitry where circuit elements, such as semiconductor elements, are combined.

In a case where the above-mentioned processors or electrical circuitry executes software (program), codes of the software to be executed, which can be read by a computer (for example, various processors or electrical circuitry forming the image generation unit 234, and/or a combination thereof), are stored in a non-transitory recording medium, such as ROM, and a computer refers to the software.

In a case where the imaging apparatus 10 receives an imaging instruction input from a shutter release switch (not shown) or the like, the imaging apparatus 10 performs the exposure control of the imaging element 210. The optical image of a subject, which is formed on the light-receiving surface of the imaging element 210 by this exposure control, is converted into electrical signals by the imaging element 210. Electric charges corresponding to the amount of light incident on a photodiode 212 (see FIG. 3) are accumulated in each pixel of the imaging element 210, and electrical signals corresponding to the quantity of electric charges accumulated in each pixel are read out as image signals and output from the imaging element 210.

The illumination device 100B comprises a light source 320 that irradiates a subject with illumination light having spectral characteristics (a wavelength range or the like) including wavelength ranges (wavelength ranges λ1, λ2, and λ3) of the plurality of wavelength selective filters arranged in the above-mentioned imaging optical system 100A, and a light source controller 310 that controls the irradiation of the subject with the illumination light performed by the light source 320. Various light sources 320 are used as the light source 320 of the illumination device 100B. For example, a halogen (lamp) or a light emitting diode (LED) is used as the light source 320.

Figure 3:
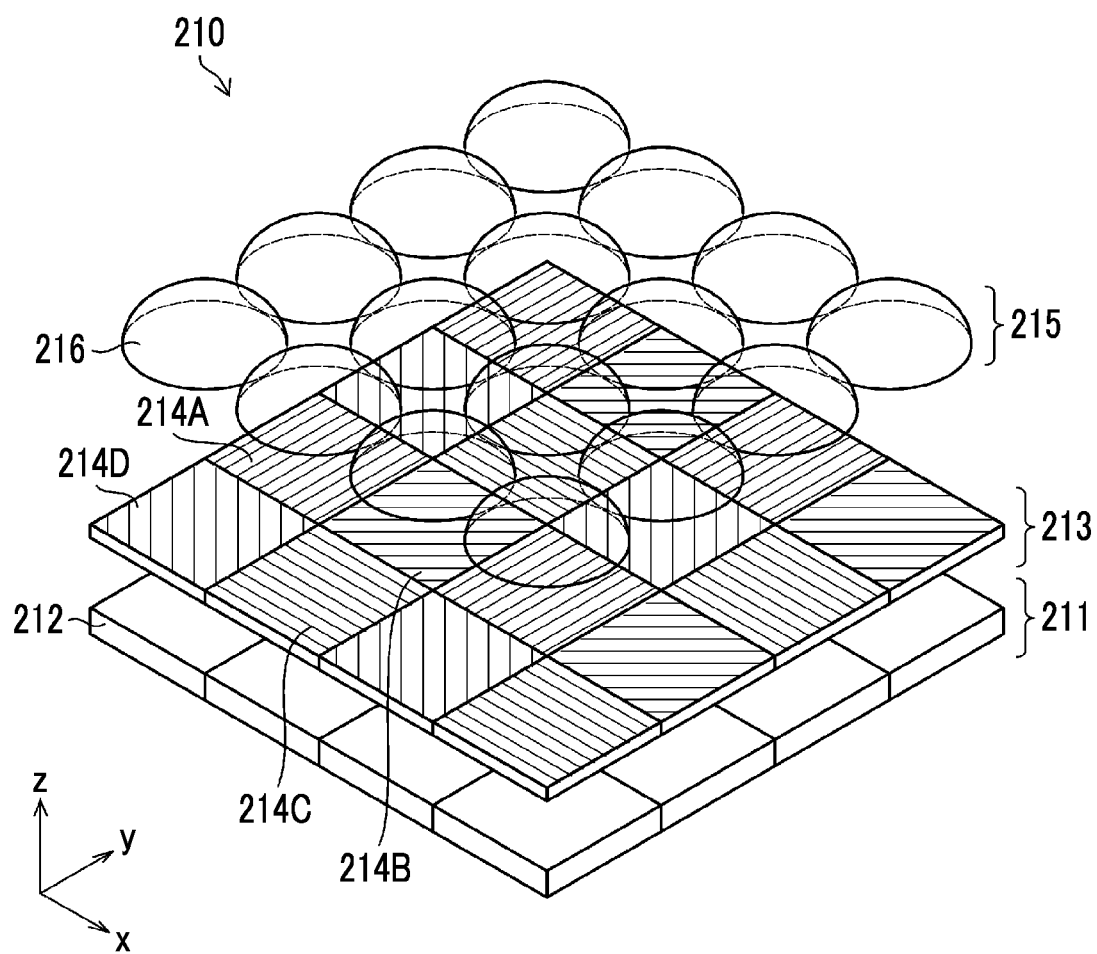
FIG. 3 is a diagram showing a schematic configuration of an imaging element.
Figure 4:
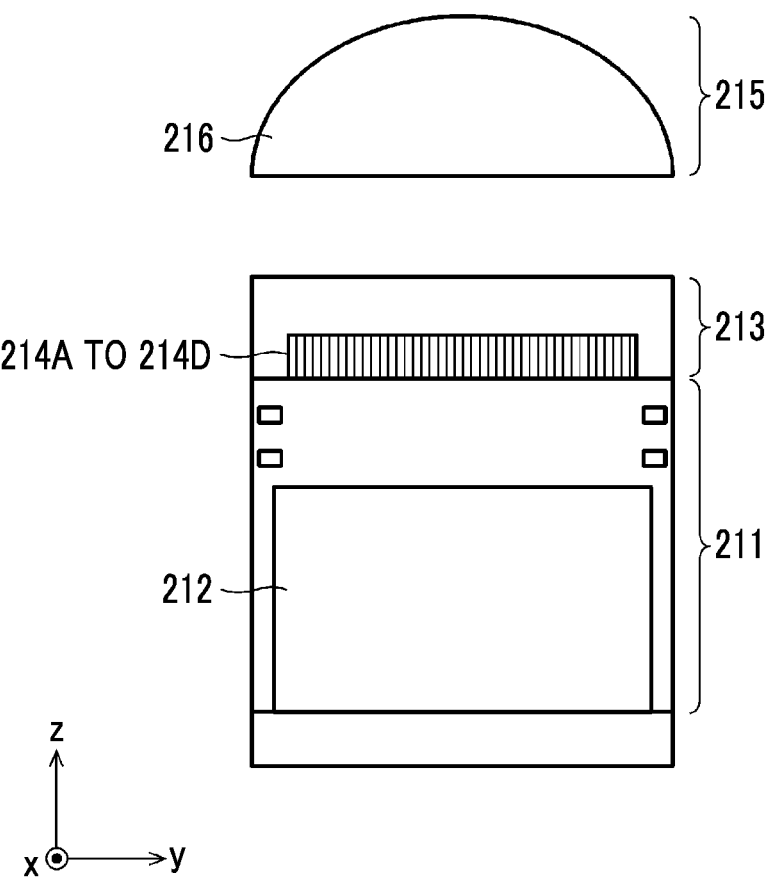
FIG. 4 is a cross-sectional view showing a schematic configuration of one pixel shown in FIG. 3.

FIG. 3 is a diagram showing a schematic configuration of the imaging element 210, and FIG. 4 is a cross-sectional view showing a schematic configuration of one pixel shown in FIG. 3. The imaging element 210 is a complementary metal-oxide semiconductor (CMOS) type imaging element (image sensor), and is a monochrome imaging element that includes a pixel array layer 211, a polarizing filter element-array layer 213, and a microlens array layer 215. The respective layers are arranged in the order of the pixel array layer 211, the polarizing filter element-array layer 213 (a plurality of polarizers), and the microlens array layer 215 from an image (plane) side toward the object side. The imaging element 210 is not limited to a CMOS type image sensor and may be an XY address type image sensor or a charge coupled device (CCD) type image sensor.

The pixel array layer 211 has a configuration in which a lot of photodiodes 212 (a plurality of pixel groups) are two-dimensionally arranged. One photodiode 212 forms one pixel. The respective photodiodes 212 are regularly arranged in a horizontal direction (x direction) and a vertical direction (y direction).

The polarizing filter element-array layer 213 has a configuration in which four types of polarizing filter elements (polarizers) 214A, 214B, 214C, and 214D (a plurality of polarizers) having different polarization directions (the polarization directions of light to be transmitted) are two-dimensionally arranged. The polarization directions of the polarizing filter elements 214A, 214B, 214C, and 214D can be set to, for example, 0°, 45°, 90°, and 135°. Further, as another example, the polarization directions of the polarizing filter elements 214A, 214B, 214C, and 214D can be set to, for example, 0°, 60°, 90°, and 120°. Furthermore, these polarization directions can be made to correspond to the polarization directions of second polarizing filters 148A to 148C (see FIG. 8) of the wavelength polarizing filter unit 130. Due to these polarizing filter elements 214A to 214D, the imaging element 210 includes a plurality of pixels, each of which selectively receives any one of pieces of light transmitted through a plurality of aperture regions. These polarizing filter elements 214A to 214D are arranged at the same intervals as the photodiodes 212, and are provided for pixels, respectively.

The microlens array layer 215 comprises microlenses 216 that are arranged for the respective pixels.

Figure 5:
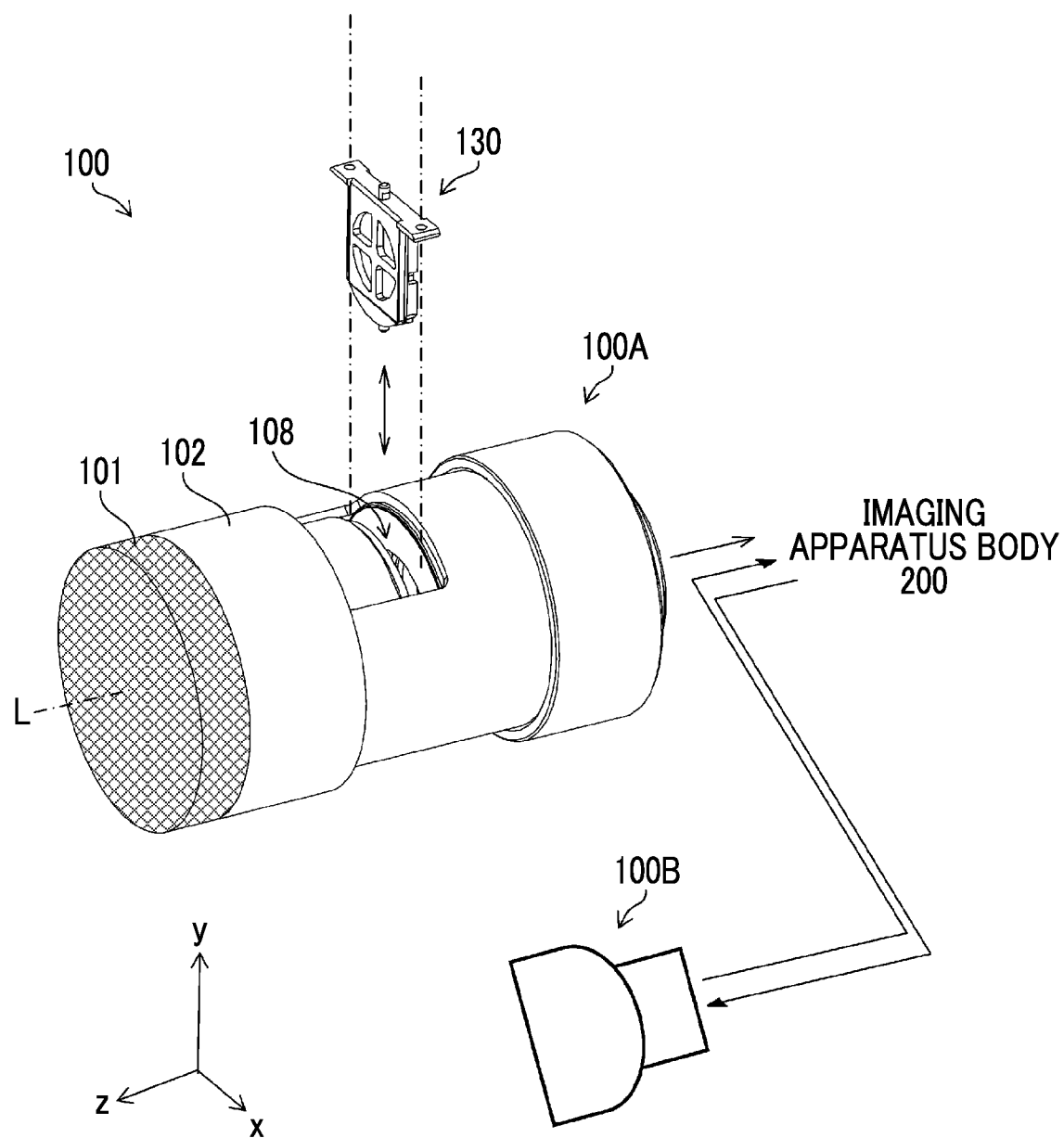
FIG. 5 is an external perspective view of a lens device.
Figure 6:
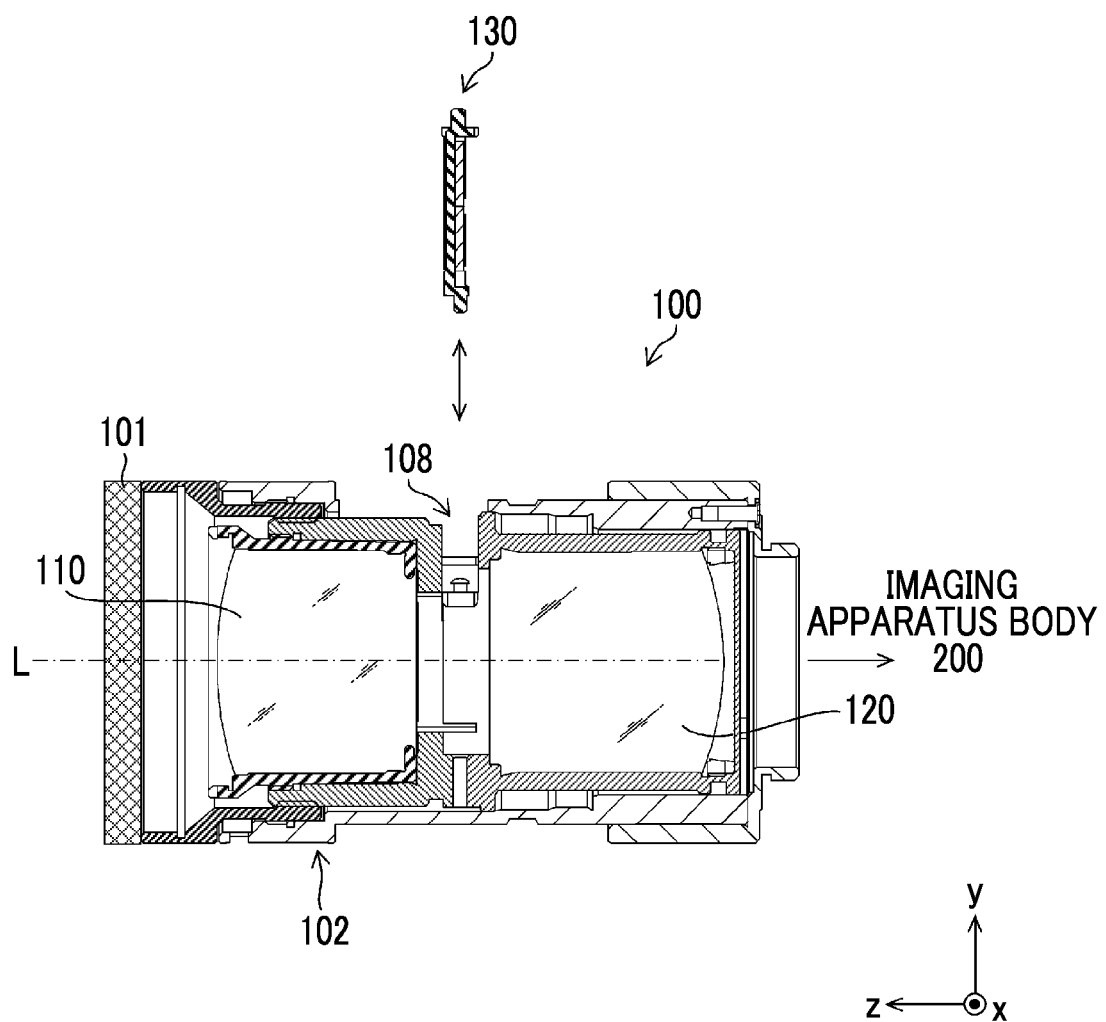
FIG. 6 is a cross-sectional view of the lens device taken along a y-z plane.

FIG. 5 is an external perspective view of the lens device 100, and FIG. 6 is a cross-sectional view of the lens device 100 taken along a y-z plane. As shown in FIGS. 5 and 6, the single imaging optical system 100A composed of the first lens 110 and the second lens 120 is disposed in a lens barrel 102 of the lens device 100. Each of the first lens 110 and the second lens 120 may be a lens group composed of a plurality of lenses. Further, a slit 108 is formed in the lens barrel 102 at a pupil position (near the pupil) of the lens device 100, and the wavelength polarizing filter unit 130 is inserted into the slit 108 and is disposed in a state where the optical axis of the wavelength polarizing filter unit 130 coincides with an optical axis L of the imaging optical system 100A.

Figure 7B:
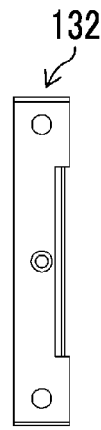
FIGS. 7A to 7F are external views of a frame.
Figure 7E:
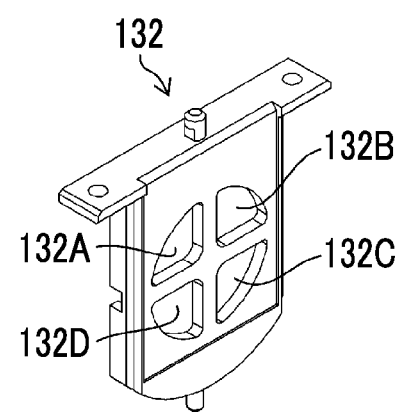
Figure 7A:
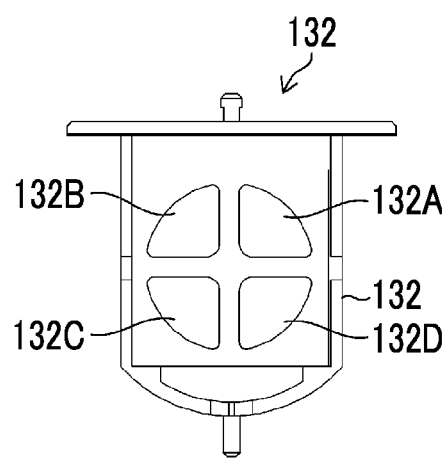
Figure 7C:
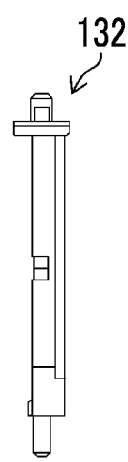
Figure 7F:
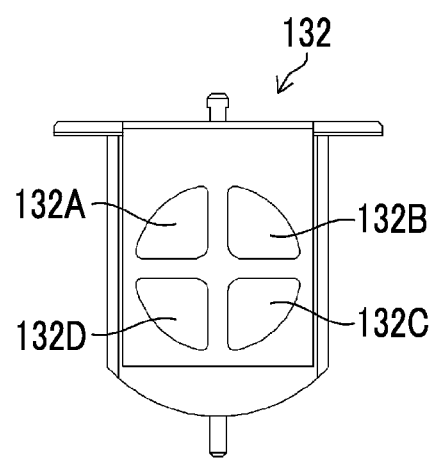
Figure 7D:
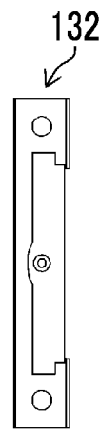
Figure 8:
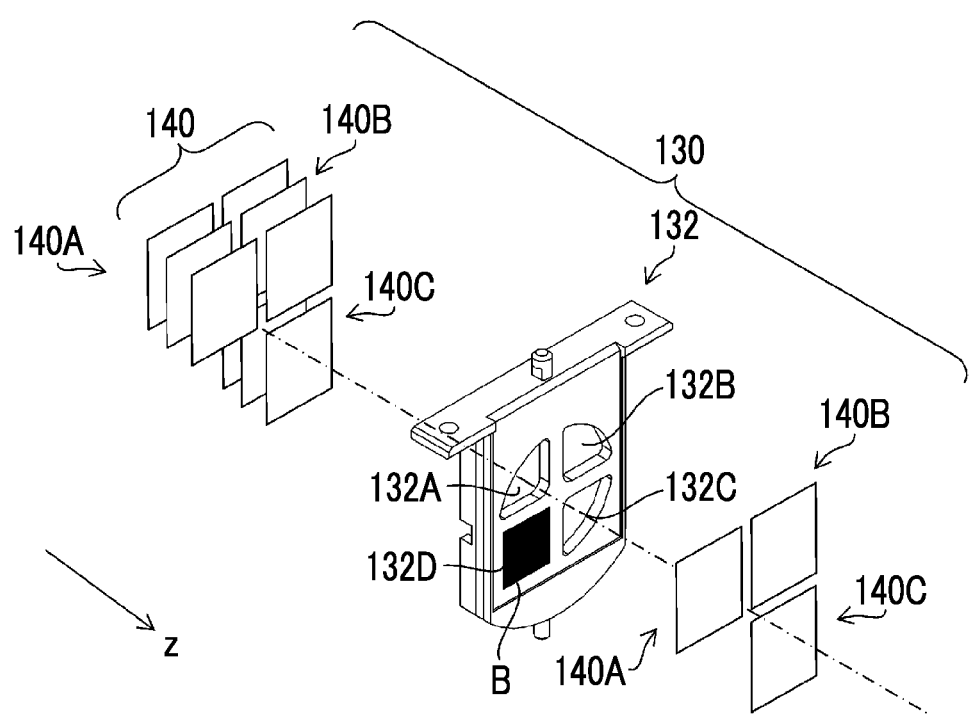
FIG. 8 is a diagram showing a configuration example of a wavelength polarizing filter unit.

FIGS. 7A to 7F are external views of a frame 132, and FIG. 8 is a diagram showing a configuration example of the wavelength polarizing filter unit 130. FIGS. 7A to 7F are a back view, a top view, a left side view, a bottom view, a perspective view, and a front view, respectively. As shown in FIGS. 7A, 7E, and 7F, the frame 132 comprises four aperture regions 132A to 132D. The aperture regions 132A to 132D correspond to first to fourth aperture regions. The shape of each of the aperture regions 132A to 132D is not limited to a fan shape, and may be other shapes, such as a circular shape, a rectangular strip shape, a rectangular shape, and a polygonal shape. Since it is sufficient to provide three aperture regions in a case where three images (images corresponding to the wavelength ranges λ1, λ2, and λ3) are to be acquired, the aperture region 132D is shielded from light by a shielding member B as shown in FIG. 8. Further, since the aperture region 132D is shielded from light by the shielding member B in this example, the aperture regions 132A to 132C are available but the present invention is not limited thereto. For example, the shielding member B may not be provided, and a wavelength selective filter having the same wavelength range and a second polarizing filter having the same polarization direction as any one of the aperture regions 132A to 132C may be disposed in the aperture region 132D.

As shown in FIG. 8, filter sets 140A to 140C (neutral density (ND) filters, wavelength selective filters, optical path length-correcting filters, and second polarizing filters) are disposed in the three aperture regions (132A to 132C) not shielded from light, respectively. A case where each of the filter sets 140A to 140C is formed of four filters is shown in FIG. 8. Further, in each of the filter sets 140A to 140C, a filter (the ND filter) closest to the object side is provided on the surface of the frame 132 facing the object side, and the other three filters (the wavelength selective filter, the optical path length-correcting filter, and the second polarizing filter) are provided on the surface of the frame 132 facing the image side. The arrangement of the filters and the position of the frame 132 disposed between the filters are not limited to the above-mentioned example, and various aspects are employed.

Figure 9:
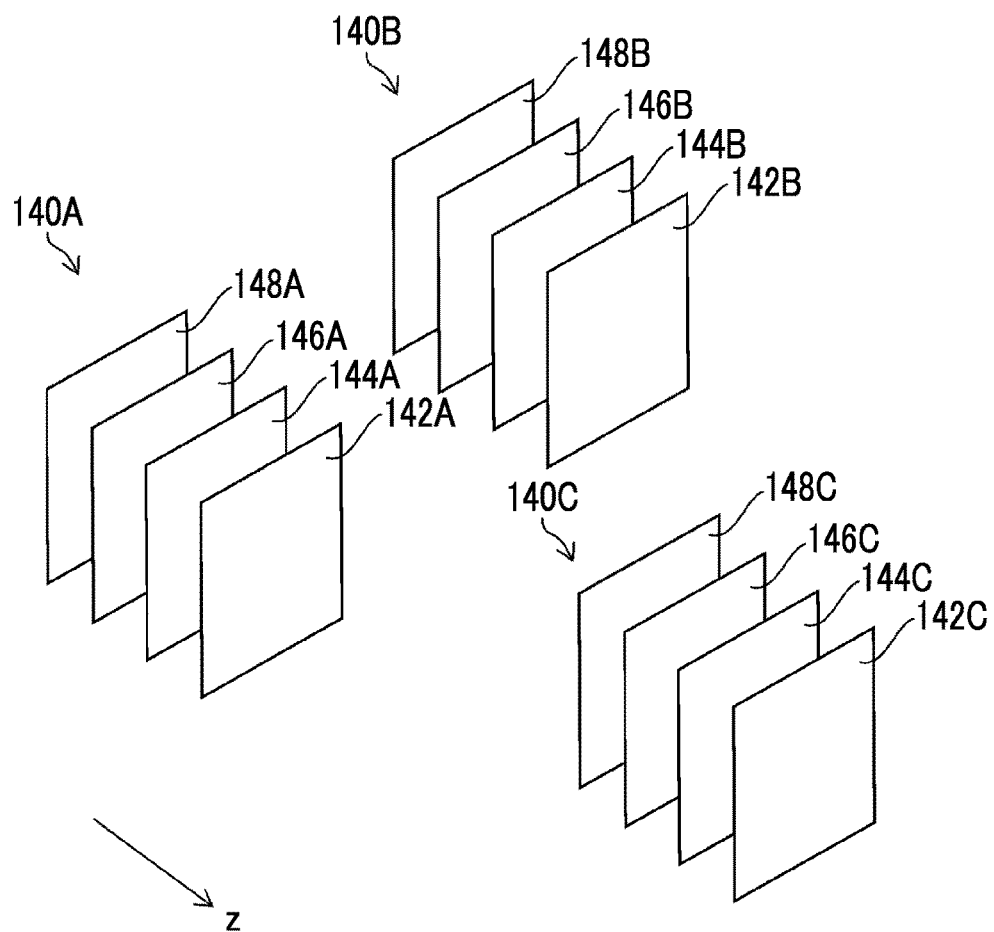
FIG. 9 is a diagram illustrating a configuration example of filter sets.

FIG. 9 is a diagram illustrating a configuration example of the filter sets 140A to 140C.

The filter set 140A is formed of four different types of filters. The filter set 140A is formed of the ND filter 142A, the wavelength selective filter 144A transmitting light having the wavelength range λ1, the optical path length-correcting filter 146A, and the second polarizing filter 148A having a polarization direction of 0° that are arranged in order from the object side. Likewise, the filter set 140B is formed of the ND filter 142B, the wavelength selective filter 144B transmitting light having the wavelength range λ2, the optical path length-correcting filter 146B, and the second polarizing filter 148B having a polarization direction of 60° that are arranged in order from the object side. Likewise, the filter set 140C is also formed of the ND filter 142C, the wavelength selective filter 144C transmitting light having the wavelength range λ3, the optical path length-correcting filter 146C, and the second polarizing filter 148C having a polarization direction of 120° that are arranged in order from the object side. Since three spectral images, that is, a spectral image corresponding to the wavelength range λ1, a spectral image corresponding to the wavelength range λ2, and a spectral image corresponding to the wavelength range λ3 are acquired in this example, the polarization directions of the second polarizing filters 148A to 148C are different from each other. For example, in a case where two spectral images are to be acquired, at least two second polarizing filters having polarization directions different from each other are used. Further, a part of the wavelength ranges λ1, λ2, and λ3 are different from each other. Furthermore, the ND filters 142A to 142C have a function of reducing the amount of rays, and the optical path length-correcting filters 146A to 146C have a function of correcting axial chromatic aberration. A case where the polarization directions are set to 0°, 60°, and 120° is shown in the present embodiment, but a combination of other angles may be used.

Figure 10:
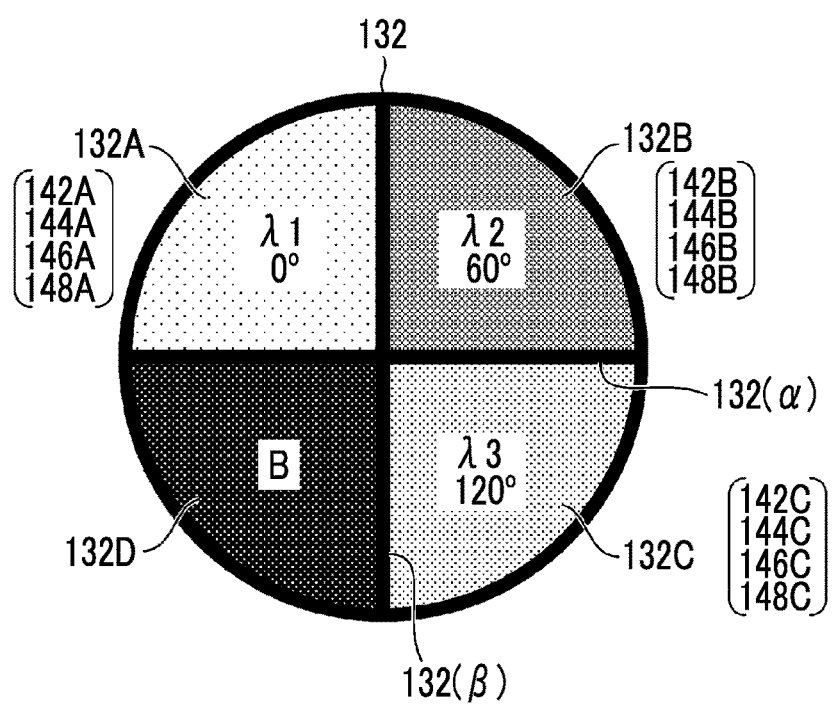
FIG. 10 is a diagram showing a relationship between aperture regions and a filter configuration.

FIG. 10 is a diagram showing a relationship between the aperture regions and a filter configuration.

The wavelength polarizing filter unit 130 includes the aperture regions 132A to 132D formed by the frame 132. Specifically, a region boundary member 132(α) of the frame 132 is disposed at a boundary between the aperture region 132A and the aperture region 132D and between the aperture region 132B and the aperture region 132C, and a region boundary member 132(β) is disposed at a boundary between the aperture region 132A and the aperture region 132B and between the aperture region 132C and the aperture region 132D. Further, the ND filters 142A to 142C, the wavelength selective filters 144A to 144C, the optical path length-correcting filters 146A to 146C, and the second polarizing filters 148A to 148C are arranged in the aperture regions 132A to 132C, respectively.

Figure 11:
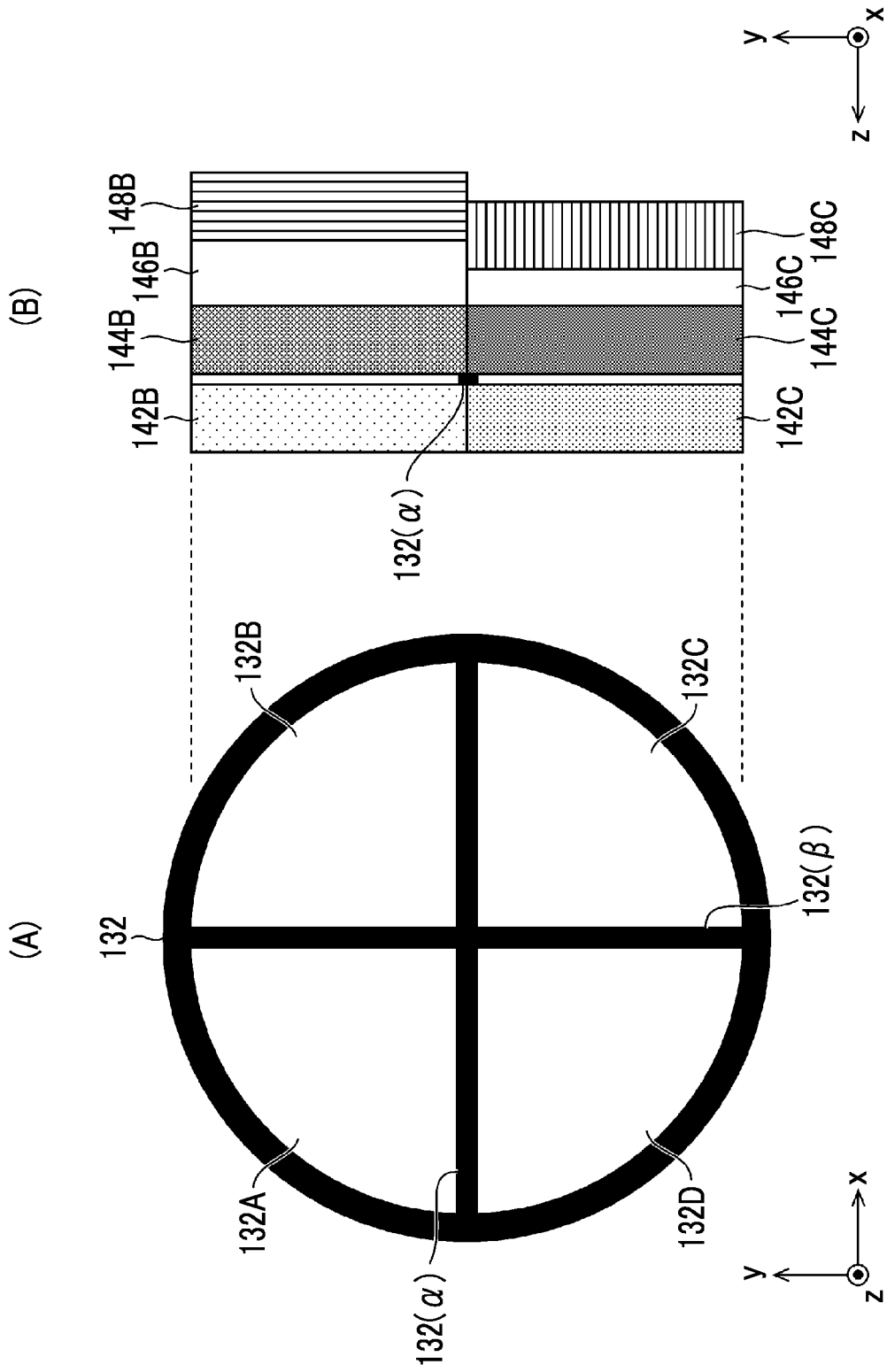
FIG. 11 is a diagram showing the frame and the filter sets.

FIG. 11 is a diagram showing the frame 132 and the filter sets 140A to 140C. (A) of FIG. 11 is a diagram showing the aperture regions 132A to 132D formed by the frame 132, and (B) of FIG. 11 is a diagram showing cross sections of the filter sets 140B and 140C disposed in the aperture regions 132B and 132C.

The ND filter 142B, the wavelength selective filter 144B, the optical path length-correcting filter 146B, and the second polarizing filter 148B are provided in the aperture region 132B. Further, the ND filter 142C, the wavelength selective filter 144C, the optical path length-correcting filter 146C, and the second polarizing filter 148C are provided in the aperture region 132C.

<Adjustment of Amount of Light Using Polarizing Filter>

As described above, the imaging apparatus 10 according to the present disclosure comprises the first polarizing filter 101 and the second polarizing filters 148A to 148C. The imaging apparatus 10 can adjust the amounts of light in the aperture regions 132A to 132C by a difference in a polarization direction between the first polarizing filter 101 and the second polarizing filters 148A to 148C.

First to fourth embodiments relating to the adjustment of the amounts of light in the aperture regions 132A to 132C of the imaging apparatus 10 will be described below.

First Embodiment

First, a first embodiment will be described. In the present embodiment, the first polarizing part is formed of the first polarizing filter 101 and the amounts of light in the aperture regions 132A to 132C is adjusted by the rotation of the first polarizing filter 101.

Figures 12, 13:
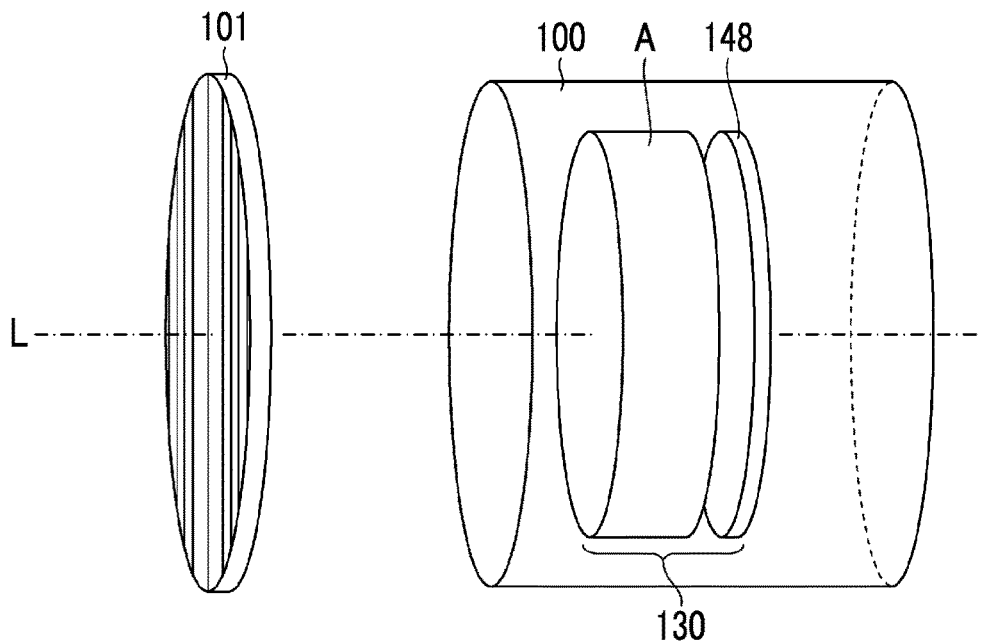
FIG. 12 is a diagram conceptually showing a first polarizing filter and the lens device.
FIG. 13 is a table illustrating the adjustment of the amount of light.

FIG. 12 is a diagram conceptually showing the first polarizing filter 101 and the lens device 100 of the present embodiment. The frame 132 of the wavelength polarizing filter unit 130 is not shown. Further, the ND filters 142A to 142C, the wavelength selective filters 144A to 144C, and the optical path length-correcting filters 146A to 146C are integrally shown as an intermediate filter A.

The first polarizing filter 101 transmits light of which the polarization direction is one direction. The first polarizing filter 101 functions as the first polarizing part, and polarizes at least a part of rays that are transmitted through the imaging optical system 100A. The first polarizing filter 101 is rotated about the optical axis L, and can change the polarization directions of the rays to be transmitted. In a case where a rotation angle θ of the first polarizing filter 101 is 0°, the polarization direction is also 0°. The first polarizing filter 101 is provided to be capable of changing the polarization direction depending on the rotation angle θ. A polarization direction of 0° is a direction parallel to a y-axis direction. Further, a clockwise rotation angle in a case where the first polarizing filter 101 is viewed from the object side to the image side is defined as a positive rotation angle, and a counterclockwise rotation angle is defined as a negative rotation angle.

The amounts of light (or changes in the amounts of light) in the aperture regions 132A to 132C can be calculated from the rotation angle θ of the first polarizing filter 101.

Specifically, a change $\alpha_i$ in the amount of light in each of the aperture regions 132A to 132C is calculated by the following equation (1). A change in the amount of light in the aperture region 132A is indicated by a change $\alpha_0$ in the amount of light, a change in the amount of light in the aperture region 132B is indicated by a change $\alpha_1$ in the amount of light, and a change in the amount of light in the aperture region 132C is indicated by a change $\alpha_2$ in the amount of light.

Change $\alpha_i$ in amount of light=$\cos^2(\theta-\Phi_i)$ (1)

θ of Equation (1) denotes the angle of the polarization direction of the first polarizing filter 101 (or the rotation angle of the first polarizing filter 101). Further, with regard to $\Phi_i$ of Equation (1), $\Phi_0$ denotes the angle of the polarization direction of the second polarizing filter in the aperture region 132A, $\Phi_1$ denotes the angle of the polarization direction of the second polarizing filter in the aperture region 132B, and $\Phi_2$ denotes the angle of the polarization direction of the second polarizing filter in the aperture region 132C.

As described above, the amounts of light in the aperture regions 132A to 132C can be adjusted by the first polarizing filter 101 and the second polarizing filters 148A to 148C.

Examples of the adjustment of the amounts of light in the aperture regions 132A to 132C will be described below.

First Example

Table 501 of FIG. 13 is a table illustrating the adjustment of the amount of light of a first example. This example is a case where the ND filters 142 are not used. Further, light having a wavelength range of blue light (denoted by "B" in the table) is selectively transmitted through the wavelength selective filter 144A disposed in the aperture region 132A, light having a wavelength range of green light (denoted by "G" in the table) is selectively transmitted through the wavelength selective filter 144B disposed in the aperture region 132B, and light having a wavelength range of red light is selectively transmitted through the wavelength selective filter 144C disposed in the aperture region 132C. Furthermore, in this example and examples to be described below, the polarization direction of the second polarizing filter 148A disposed in the aperture region 132A is set to 0°, the polarization direction of the second polarizing filter 148B disposed in the aperture region 132B is set to 60°, and the polarization direction of the second polarizing filter 148C disposed in the aperture region 132C is set to 120°.

In a case where the light source 320 is a halogen lamp, it is possible to make a ratio between the amounts of light in the aperture regions 132A to 132C close to 1:1:1 by rotating the first polarizing filter 101 clockwise by an angle of 4°. Accordingly, a balance between the amounts of light in the respective aperture regions can be improved. A description will be made below using Table 501.

In a case where the light source 320 is a halogen lamp and the first polarizing filter 101 is not provided (initial state), the amount of light of 40 is obtained in the aperture region 132A ("B"), the amount of light of 100 is obtained in the aperture region 132B ("G"), and the amount of light of 140 is obtained in the aperture region 132C ("R") (item (1) in Table 501). A change in the amount of light in each of the aperture regions 132A to 132C in a case where the first polarizing filter 101 is rotated clockwise by an angle of 4° is calculated by the above-mentioned equation (1) (item (2) in Table 501). Further, the product of the amount of light in the initial state in a case where the light source 320 is a halogen lamp and the calculated change in the amount of light is calculated, so that the amounts of light in the aperture regions 132A to 132C in a case where the first polarizing filter 101 is rotated clockwise by an angle of 4° are calculated (item (3) in Table 501). A ratio between these amounts of light is 1.27297:1:0.860377 (item (4) in Table 501), and it is possible to improve a balance between the amounts of light in the aperture regions 132A to 132C by rotating the first polarizing filter 101 clockwise by an angle of 4°.

In a case where the light source 320 is an LED, it is possible to make a ratio between the amounts of light in the aperture regions 132A to 132C close to 1:1:1 by rotating the first polarizing filter 101 counterclockwise by an angle of 63°. Accordingly, a balance between the amounts of light in the respective aperture regions can be improved. A description will be made below using Table 501.

In a case where the light source 320 is an LED and the first polarizing filter 101 is not provided (initial state), the amount of light of 140 is obtained in the aperture region 132A ("B"), the amount of light of 100 is obtained in the aperture region 132B ("G"), and the amount of light of 30 is obtained in the aperture region 132C ("R") (item (5) in Table 501). A change in the amount of light in each of the aperture regions 132A to 132C in a case where the first polarizing filter 101 is rotated counterclockwise by an angle of 63° is calculated by the above-mentioned equation (1) (item (6) in Table 501). Further, the product of the amount of light in the initial state in a case where the light source 320 is an LED and the calculated change in the amount of light is calculated, so that the amounts of light in the aperture regions 132A to 132C in a case where the first polarizing filter 101 is rotated counterclockwise by an angle of 63° are calculated (item (7) in Table 501). A ratio between these amounts of light is 0.972756:1:1.008585 (item (8) in Table 501), and it is possible to improve a balance between the amounts of light in the aperture regions 132A to 132C by rotating the first polarizing filter 101 counterclockwise by an angle of 63°.

Even in a case where the light source 320 is a halogen lamp or an LED, it is possible to make a ratio between the amounts of light in the aperture regions 132A to 132C close to 1:1:1 by rotating the first polarizing filter 101 by a predetermined angle as described above. Accordingly, a balance between the amounts of light in the respective aperture regions can be improved.

Second Example

Next, a second example will be described. Table 503 of FIG. 14 is a table illustrating the adjustment of the amount of light of a second example. This example is a case where the light source 320 is changed from a halogen lamp to an LED. Further, the ND filters 142A to 142C are set for a case where the light source 320 is a halogen lamp and a rotation angle θ of the first polarizing filter 101 is 0°. Other settings are the same as those of a first example.

In a case where the light source 320 is changed from a halogen lamp to an LED, it is possible to make a ratio between the amounts of light in the aperture regions 132A to 132C close to 1:1:1 by rotating the first polarizing filter 101 clockwise by an angle of 121°. Accordingly, a balance between the amounts of light in the respective aperture regions can be improved. A description will be made below using Table 503.

In an initial state (the first polarizing filter 101 is not provided and the ND filters 142A to 142C are not provided) in a case where the light source 320 is an LED and a halogen lamp, the same amounts of light as the first example are obtained in the aperture regions 132A to 132C (items (1) and (2) in Table 503). In a case where the rotation angle of the first polarizing filter 101 is 0°, a change in the amount of light in each of the aperture regions 132A to 132C is calculated by the above-mentioned equation (1) (item (3) in Table 503). Changes in the amounts of light in the ND filters 142A to 142C are set in accordance with a case where the light source 320 is a halogen lamp (item (4) in Table 503). That is, the amount of light in the aperture region 132A ("B") is 25 (=40×1×0.625), the amount of light in the aperture region 132B ("G") is 25 (=100×0.25×1), and the amount of light in the aperture region 132C ("R") is 25 (=140×0.25×0.714286) (the product of items (2), (3), and (4) in Table 503). As described above, a balance between the amounts of light in the aperture regions 132A to 132C is good in a case where the light source 320 is a halogen lamp.

On the other hand, in a case where the light source 320 is changed from a halogen lamp to an LED, a balance between the amounts of light described above is lost since the ND filters 142A to 142C have been set for a halogen lamp (item (5) in Table 503).

Accordingly, a user rotates the first polarizing filter 101 clockwise by an angle of 121° to change a change in the amount of light (item (6) in Table 503). In a case where the first polarizing filter 101 is rotated clockwise by an angle of 121° as described above, the amounts of light in the aperture regions 132A to 132C are changed (item (7) in Table 503). Accordingly, since a ratio between the amounts of light in the aperture regions 132A to 132C is changed to 0.987516: 1:0.91142 (item (8) in Table 503), an imbalance between the amounts of light can be suppressed even in a case where the light source 320 is changed to an LED.

In a case where the light source 320 is changed from a halogen lamp to an LED in a state where the ND filters 142A to 142C are set for a halogen lamp as described above, a user rotates the first polarizing filter 101 to change a polarization direction and to adjust the amounts of light in the aperture regions 132A to 132C. Accordingly, an imbalance between the amounts of light in the aperture regions 132A to 132C can be suppressed.

Third Example

Next, a third example will be described. Table 505 of FIG. 15 is a table illustrating the adjustment of the amount of light of a third example. This example is a case where the light source 320 is changed from an LED to a halogen lamp. Further, the ND filters 142A to 142C are set for a case where the light source 320 is an LED and a rotation angle θ of the first polarizing filter 101 is 120°. Other settings are the same as those of the first example.

In a case where the light source 320 is changed from an LED to a halogen lamp, it is possible to make a ratio between the amounts of light in the aperture regions 132A to 132C close to 1:1:1 by rotating the first polarizing filter 101 clockwise by an angle of 1°. Accordingly, an imbalance between the amounts of light in the respective aperture regions can be suppressed. A description will be made below using Table 505.

In an initial state (the first polarizing filter 101 is not provided and the ND filters 142A to 142C are not provided) in a case where the light source 320 is an LED and a halogen lamp, the same amounts of light as the first example are obtained in the aperture regions 132A to 132C (items (1) and (2) in Table 505). In a case where the rotation angle of the first polarizing filter 101 is 120°, a change in the amount of light in each of the aperture regions 132A to 132C is calculated by the above-mentioned equation (1) (item (3) in Table 505). Changes in the amounts of light in the ND filters 142A to 142C are set in accordance with a case where the light source 320 is an LED (item (4) in Table 505). That is, the amount of light in the aperture region 132A ("B") is 25 (=140×0.25×0.714286), the amount of light in the aperture region 132B ("G") is 25 (=100×0.25×1), and the amount of light in the aperture region 132C ("R") is 25 (=30×1× 0.833333) (the product of items (2), (3), and (4) in Table 505). As described above, a balance between the amounts of light in the aperture regions 132A to 132C is good in a case where the light source 320 is an LED.

On the other hand, in a case where the light source 320 is changed from an LED to a halogen lamp, a balance between the amounts of light described above is lost since the ND filters 142A to 142C have been set for an LED (item (5) in Table 505).

Accordingly, a user rotates the first polarizing filter 101 clockwise by an angle of 1° to change a change in the amount of light (item (6) in Table 505). In a case where the first polarizing filter 101 is rotated clockwise by an angle of 1° as described above, the amounts of light in the aperture regions 132A to 132C are changed (item (7) in Table 505). Accordingly, since a ratio between the amounts of light in the aperture regions 132A to 132C is changed to 1.076765: 1:1.033738 (item (8) in Table 505), it is possible to suppress an imbalance between the amounts of light even in a case where the light source 320 is changed to a halogen lamp.

In a case where the light source 320 is changed from an LED to a halogen lamp in a state where the ND filters 142A to 142C are set for an LED as described above, a user rotates the first polarizing filter 101 to change a polarization direction and to adjust the amounts of light in the aperture regions 132A to 132C. Accordingly, an imbalance between the amounts of light in the aperture regions 132A to 132C can be suppressed.

Second Embodiment

First, a second embodiment will be described. In the present embodiment, the first polarizing part is formed of a first polarizing filter 101 that includes a plurality of regions having polarization directions different from each other. Accordingly, in a case where the first polarizing filter 101 is rotated, the amounts of light in the aperture regions 132A to 132C are adjusted.

FIG. 16 is a diagram conceptually showing the first polarizing filter 101 and the lens device 100 of the present embodiment. The frame 132 of the wavelength polarizing filter unit 130 is not shown. Further, the ND filters 142A to 142C, the wavelength selective filters 144A to 144C, and the optical path length-correcting filters 146A to 146C are integrally shown as an intermediate filter A.

The first polarizing filter 101 includes a plurality of regions having polarization directions different from each other. Specifically, the first polarizing filter 101 includes four regions 101A to 101D having polarization directions different from each other. In a case where a rotation angle θ of the first polarizing filter 101 is 0°, an angle of the polarization direction of the region 101A is set to 150°, an angle of the polarization direction of the region 101B is set to 172°, an angle of the polarization direction of the region 101C is set to 53°, and an angle of the polarization direction of the region 101D is set to 20°.

A change $\alpha_i$ in the amount of light in each of the aperture regions 132A to 132C can be calculated by the following equation (2). A change in the amount of light in the aperture region 132A is indicated by a change $\alpha_0$ in the amount of light, a change in the amount of light in the aperture region 132B is indicated by a change $\alpha_1$ in the amount of light, a change in the amount of light in the aperture region 132C is indicated by a change $\alpha_2$ in the amount of light, and a change in the amount of light in the aperture region 132D is indicated by a change as in the amount of light. The aperture region 132D is shielded from light by a shielding member B in the example of the imaging apparatus 10 described above.

Change $\alpha_i$ in amount of light = (2)

$$\frac{\theta'}{90}\cos^2(\theta + \psi_a - \phi_i) + \left(1 - \frac{\theta'}{90}\right)\cos^2(\theta + \psi_b - \phi_i)$$

The following values are shown in Equation (2).

$\theta' = (\theta + 180)\%90$ $$a = \begin{cases} (i+1)\%4 & (-180° \leq \theta < -90°) \\ i\%4 & (-90° \leq \theta < 0°) \\ (i+3)\%4 & (0° \leq \theta < 90°) \\ (i+2)\%4 & (90° \leq \theta < 180°) \end{cases}$$

$$b = \begin{cases} (i+2)\%4 & (-180° \leq \theta < -90°) \\ (i+1)\%4 & (-90° \leq \theta < 0°) \\ i\%4 & (0° \leq \theta < 90°) \\ (i+3)\%4 & (90° \leq \theta < 180°) \end{cases}$$

The notation of A % B means a remainder obtained in a case where A is divided by B.

Rotation angle of first polarizing filter: $\theta$
POLARIZATION ANGLE OF APERTURE REGION 132 A: $\Phi_0$
POLARIZATION ANGLE OF APERTURE REGION 132 B: $\Phi_1$
POLARIZATION ANGLE OF APERTURE REGION 132 C: $\Phi_2$
POLARIZATION ANGLE OF APERTURE REGION 132 D: $\Phi_3$
POLARIZATION ANGLE OF REGION 101 A: $\psi_0$
POLARIZATION ANGLE OF REGION 101 B: $\psi_1$
POLARIZATION ANGLE OF REGION 101 C: $\psi_2$
POLARIZATION ANGLE OF REGION 101 D: $\psi_3$ As described above, the amounts of light in the aperture regions 132A to 132C can be adjusted by the first polarizing filter 101 and the second polarizing filters 148A to 148C.

Examples of the adjustment of the amounts of light in the aperture regions 132A to 132C will be described below.

Fourth Example

Table 507 of FIG. 17 is a table illustrating the adjustment of the amount of light of a fourth example. This example is a case where the ND filters 142 are not used. Further, the wavelength selective filters 144A to 144C and the second polarizing filters 148A to 148C disposed in the respective aperture regions are the same as those of the first example.

In a case where the light source 320 is a halogen lamp, it is possible to make a ratio between the amounts of light in the aperture regions 132A to 132C close to 1:1:1 by rotating the first polarizing filter 101 counterclockwise by an angle of 10°. Accordingly, a balance between the amounts of light in the respective aperture regions can be improved. A description will be made below using Table 507.

In a case where the light source 320 is a halogen lamp and the first polarizing filter 101 is not provided (initial state), the amount of light of 40 is obtained in the aperture region 132A ("B"), the amount of light of 100 is obtained in the aperture region 132B ("G"), and the amount of light of 140 is obtained in the aperture region 132C ("R") (item (1) in Table 507). A change in the amount of light in each of the aperture regions 132A to 132C in a case where the first polarizing filter 101 is rotated counterclockwise by an angle of 10° is calculated by the above-mentioned equation (2) (item (2) in Table 507). Further, the product of the amount of light in the initial state in a case where the light source 320 is a halogen lamp and the calculated change in the amount of light is calculated, so that the amounts of light in the aperture regions 132A to 132C in a case where the first polarizing filter 101 is rotated counterclockwise by an angle of 10° are calculated (item (3) in Table 507). A ratio between these amounts of light is 0.994268:1:1.0242 (item (4) in Table 507), and it is possible to improve a balance between the amounts of light in the aperture regions 132A to 132C by rotating the first polarizing filter 101 counterclockwise by an angle of 10°.

In a case where the light source 320 is an LED, it is possible to make a ratio between the amounts of light in the aperture regions 132A to 132C close to 1:1:1 by rotating the first polarizing filter 101 counterclockwise by an angle of 76°. Accordingly, a balance is improved. A description will be made below using Table 507.

In a case where the light source 320 is an LED and the first polarizing filter 101 is not provided (initial state), the amount of light of 140 is obtained in the aperture region 132A ("B"), the amount of light of 100 is obtained in the aperture region 132B ("G"), and the amount of light of 30 is obtained in the aperture region 132C ("R") (item (5) in Table 507). A change in the amount of light in each of the aperture regions 132A to 132C in a case where the first polarizing filter 101 is rotated counterclockwise by an angle of 76° is calculated by the above-mentioned equation (2) (item (6) in Table 507). Further, the product of the amount of light in the initial state in a case where the light source 320 is an LED and the calculated change in the amount of light is calculated, so that the amounts of light in the aperture regions 132A to 132C in a case where the first polarizing filter 101 is rotated counterclockwise by an angle of 76° are calculated (item (7) in Table 507). A ratio between these amounts of light is 1.038306:1:0.984503 (item (8) in Table 507), and it is possible to improve a balance between the amounts of light in the aperture regions 132A to 132C by rotating the first polarizing filter 101 counterclockwise by an angle of 76°.

Even in a case where the light source 320 is a halogen lamp or an LED, it is possible to make a ratio between the amounts of light in the aperture regions 132A to 132C close to 1:1:1 by rotating the first polarizing filter 101 by a predetermined angle as described above. Accordingly, a balance between the amounts of light in the respective aperture regions can be improved.

Fifth Example

Next, a fifth example will be described. Table 509 of FIG. 18 is a table illustrating the adjustment of the amount of light of a fifth example. This example is a case where the light source 320 is changed from a halogen lamp to an LED. Further, the ND filters 142A to 142C are set for a case where the light source 320 is a halogen lamp and a rotation angle $\theta$ of the first polarizing filter 101 is −57°. Other settings are the same as those of the first example.

In a case where the light source 320 is changed from a halogen lamp to an LED, it is possible to make a ratio between the amounts of light in the aperture regions 132A to 132C close to 1:1:1 by rotating the first polarizing filter 101 counterclockwise by an angle of 57°. Accordingly, a balance between the amounts of light in the respective aperture regions can be improved. A description will be made below using Table 509.

In an initial state (the first polarizing filter 101 is not provided and the ND filters 142A to 142C are not provided) in a case where the light source 320 is an LED and a halogen lamp, the same amounts of light as the first example are obtained in the aperture regions 132A to 132C (items (1) and (2) in Table 509). In a case where the rotation angle of the first polarizing filter 101 is 57° counterclockwise, a change in the amount of light in each of the aperture regions 132A to 132C is calculated by the above-mentioned equation (2) (item (3) in Table 509). Changes in the amounts of light in the ND filters 142A to 142C are set in accordance with a case where the light source 320 is a halogen lamp (item (4) in Table 509). That is, the amount of light in the aperture region 132A ("B") is 15.8296 (=40×0.395742×1), the amount of light in the aperture region 132B ("G") is 15.8296 (=100× 0.250463×0.632017), and the amount of light in the aperture region 132C ("R") is 15.8296 (=140×0.218296×0.517962) (the product of items (2), (3), and (4) in Table 509).

On the other hand, in a case where the light source 320 is changed from a halogen lamp to an LED, a balance between the amounts of light described above is lost since the ND filters 142A to 142C have been set for a halogen lamp (item (5) in Table 509).

Accordingly, a user rotates the first polarizing filter 101 counterclockwise by an angle of 169° to change a change in the amount of light (item (6) in Table 509). In a case where the first polarizing filter 101 is rotated counterclockwise by an angle of 169° as described above, the amounts of light in the aperture regions 132A to 132C are changed (item (7) in Table 509). Accordingly, since a ratio between the amounts of light in the aperture regions 132A to 132C is changed to 1.021719:1:1.028647, an imbalance between the amounts of light can be suppressed even in a case where the light source 320 is changed to an LED.

In a case where the light source 320 is changed from a halogen lamp to an LED in a state where the ND filters 142A to 142C are set for a halogen lamp as described above, a user rotates the first polarizing filter 101 to change a polarization direction and to adjust the amounts of light in the aperture regions 132A to 132C. Accordingly, an imbalance between the amounts of light in the aperture regions 132A to 132C can be suppressed.

Sixth Example

Next, a sixth example will be described. Table 511 of FIG. 19 is a table illustrating the adjustment of the amount of light of a sixth example. This example is a case where the light source 320 is changed from an LED to a halogen lamp. Further, the ND filters 142A to 142C are set for a case where the light source 320 is an LED and the first polarizing filter 101 is rotated counterclockwise by an angle of 11°. Other settings are the same as those of the first example.

In a case where the light source 320 is changed from a halogen lamp to an LED, it is possible to make a ratio between the amounts of light in the aperture regions 132A to 132C close to 1:1:1 by rotating the first polarizing filter 101 counterclockwise by an angle of 132°. Accordingly, an imbalance between the amounts of light in the respective aperture regions can be suppressed. A description will be made below using Table 511.

In an initial state (the first polarizing filter 101 is not provided and the ND filters 142A to 142C are not provided) in a case where the light source 320 is an LED and a halogen lamp, the same amounts of light as the first example are obtained in the aperture regions 132A to 132C (items (1) and (2) in Table 511). In a case where the first polarizing filter 101 is rotated counterclockwise to a position corresponding to an angle of 11°, a change in the amount of light in each of the aperture regions 132A to 132C is calculated by the above-mentioned equation (2) (item (3) in Table 511). Changes in the amounts of light in the ND filters 142A to 142C are set in accordance with a case where the light source 320 is an LED (item (4) in Table 511). That is, the amount of light in the aperture region 132A ("B") is 20.587 (=140×0.147053×1), the amount of light in the aperture region 132B ("G") is 20.587 (=100×0.89386×0.23032), and the amount of light in the aperture region 132C ("R") is 20.587 (=30×0.982663×0.698353) (the product of items (2), (3), and (4) in Table 511). As described above, a balance between the amounts of light in the aperture regions 132A to 132C is good in a case where the light source 320 is an LED.

On the other hand, in a case where the light source 320 is changed from an LED to a halogen lamp, a balance between the amounts of light described above is lost since the ND filters 142A to 142C have been set for an LED (item (5) in Table 511).

Accordingly, a user rotates the first polarizing filter 101 counterclockwise by an angle of 132° to change a change in the amount of light (item (6) in Table 511). In a case where the first polarizing filter 101 is rotated counterclockwise by an angle of 132° as described above, the amounts of light in the aperture regions 132A to 132C are changed (item (7) in Table 511). Accordingly, since a ratio between the amounts of light in the aperture regions 132A to 132C is changed to 1.046081:1:1.001267, it is possible to suppress an imbalance between the amounts of light even in a case where the light source 320 is changed to a halogen lamp.

In a case where the light source 320 is changed from an LED to a halogen lamp in a state where the ND filters 142A to 142C are set for an LED as described above, a user rotates the first polarizing filter 101 to change a polarization direction. Accordingly, an imbalance between the amounts of light in the aperture regions 132A to 132C can be suppressed.

Third Embodiment

Next, a third embodiment will be described. In the present embodiment, the first polarizing part is formed of a first polarizing filter 101 that includes a plurality of regions of which polarization directions can be changed independently. Accordingly, in a case where the first polarizing filter 101 is rotated, the amounts of light in the aperture regions 132A to 132C are adjusted.

FIG. 20 is a diagram conceptually showing the first polarizing filter 101 of the present embodiment. The first polarizing filter 101 includes three regions 101A to 101C of which polarization directions can be changed independently. The regions 101A to 101C are rotated about rotation axes LA to LC, so that polarization directions can be changed. Specifically, each of the regions 101A to 101C has one polarization direction and the regions 101A to 101C are rotated about the rotation axes LA to LC, so that the polarization directions of rays passing through the regions can be changed. Further, the region 101A corresponds to the aperture region 132A, the region 101B corresponds to the aperture region 132B, and the region 101C corresponds to the aperture region 132C.

As described above, in the present embodiment, the amount of light in each region can be adjusted by interaction between the polarization directions of the regions 101A to 101C of the first polarizing filter 101 and the polarization directions of the second polarizing filters.

A change $\alpha_i$ in the amount of light in each of the aperture regions 132A to 132C is represented by the following equation (3). A change in the amount of light in the aperture region 132A is indicated by a change $\alpha_0$ in the amount of light, a change in the amount of light in the aperture region 132B is indicated by a change $\alpha_1$ in the amount of light, and a change in the amount of light in the aperture region 132C is indicated by a change $\alpha_2$ in the amount of light.

$$\text{Change } \alpha_i \text{ in amount of light} = \cos^2(\psi_i - \phi_i) \tag{3}$$

The following values are shown in Equation (3).
POLARIZATION ANGLE OF APERTURE REGION 132 A: $\phi_0$
POLARIZATION ANGLE OF APERTURE REGION 132 B: $\phi_1$
POLARIZATION ANGLE OF APERTURE REGION 132 C: $\phi_2$
POLARIZATION ANGLE OF REGION 101 A: $\psi_0$
POLARIZATION ANGLE OF REGION 101 B: $\psi_1$
POLARIZATION ANGLE OF REGION 101 C: $\psi_2$ As described above, the amounts of light in the aperture regions 132A to 132C can be adjusted by the regions of the first polarizing filter 101 and the second polarizing filters 148A to 148C.

Examples of the adjustment of the amounts of light in the aperture regions 132A to 132C will be described below.

Seventh Example

Table 513 of FIG. 21 is a table illustrating the adjustment of the amount of light of a seventh example. This example is a case where the ND filters 142 are not used. Further, the wavelength selective filters 144A to 144C and the second polarizing filters 148A to 148C disposed in the respective aperture regions are the same as those of the first example.

In a case where the light source 320 is a halogen lamp, it is possible to make a ratio between the amounts of light in the aperture regions 132A to 132C close to 1:1:1 by setting the polarization angle of the region 101A of the first polarizing filter 101 to 4°, setting the polarization angle of the region 101B to 9°, and setting the polarization angle of the region 101C to −2°. Accordingly, a balance between the amounts of light in the respective aperture regions can be improved. A description will be made below using Table 513.

In a case where the light source 320 is a halogen lamp and the first polarizing filter 101 is not provided (initial state), the amount of light of 40 is obtained in the aperture region 132A ("B"), the amount of light of 100 is obtained in the aperture region 132B ("G"), and the amount of light of 140 is obtained in the aperture region 132C ("R") (item (1) in Table 513). A change in the amount of light in each of the aperture regions 132A to 132C in a case where the polarization direction of the region 101A of the first polarizing filter 101 is set to 4°, the polarization direction of the region 101B is set to 9°, and the polarization direction of the region 101C is set to −2° is calculated by the above-mentioned equation (3) (item (2) in Table 513). Further, the product of the amount of light in the initial state in a case where the light source 320 is a halogen lamp and the calculated change in the amount of light is calculated, so that the amounts of light in the aperture regions 132A to 132C in a case where the respective regions 101A to 101C of the first polarizing filter 101 are set as described above are calculated (item (3) in Table 513). A ratio between these amounts of light is 1.005074:1:0.992668 (item (4) in Table 513), and it is possible to improve a balance between the amounts of light in the aperture regions 132A to 132C by setting the polarization direction of the region 101A of the first polarizing filter 101 to 4°, setting the polarization direction of the region 101B to 9°, and setting the polarization direction of the region 101C to −2°.

In a case where the light source 320 is an LED, it is possible to make a ratio between the amounts of light in the aperture regions 132A to 132C close to 1:1:1 by setting the polarization direction of the region 101A of the first polarizing filter 101 to −71°, setting the polarization direction of the region 101B to −8°, and setting the polarization direction of the region 101C to −14°. Accordingly, a balance between the amounts of light in the respective aperture regions can be improved. A description will be made below using Table 513.

In a case where the light source 320 is an LED and the first polarizing filter 101 is not provided (initial state), the amount of light of 140 is obtained in the aperture region 132A ("B"), the amount of light of 100 is obtained in the aperture region 132B ("G"), and the amount of light of 30 is obtained in the aperture region 132C ("R") (item (5) in Table 513). A change in the amount of light in each of the aperture regions 132A to 132C in a case where the polarization direction of the region 101A of the first polarizing filter 101 is set to −71°, the polarization direction of the region 101B is set to −8°, and the polarization direction of the region 101C is set to −14° is calculated by the above-mentioned equation (3) (item (6) in Table 513). Further, the product of the amount of light in the initial state in a case where the light source 320 is an LED and the calculated change in the amount of light is calculated, so that the amounts of light in the aperture regions 132A to 132C in a case where the regions 101A to 101C of the first polarizing filter 101 are set as described above are calculated (item (7) in Table 513). A ratio between these amounts of light is 1.057453:1:1.031604 (item (8) in Table 513), and it is possible to improve a balance between the amounts of light in the aperture regions 132A to 132C by setting the polarization directions of the regions 101A to 101C of the first polarizing filter 101 as described above.

Even in a case where the light source 320 is a halogen lamp or an LED, it is possible to make a ratio between the amounts of light in the aperture regions 132A to 132C close to 1:1:1 by setting the polarization directions of the regions 101A to 101C of the first polarizing filter 101 to predetermined angles as described above. Accordingly, a balance between the amounts of light in the respective aperture regions can be improved.

<Other Examples of First Polarizing Part>

A case where the first polarizing filter 101 is provided on the front surface of the imaging optical system 100A facing the object side as the first polarizing part has been described in the examples of the above-mentioned first to third embodiments (see FIG. 5). However, other aspects of the first polarizing part may also be employed in the present disclosure. Other examples of the first polarizing part will be described below.

Figure 22:
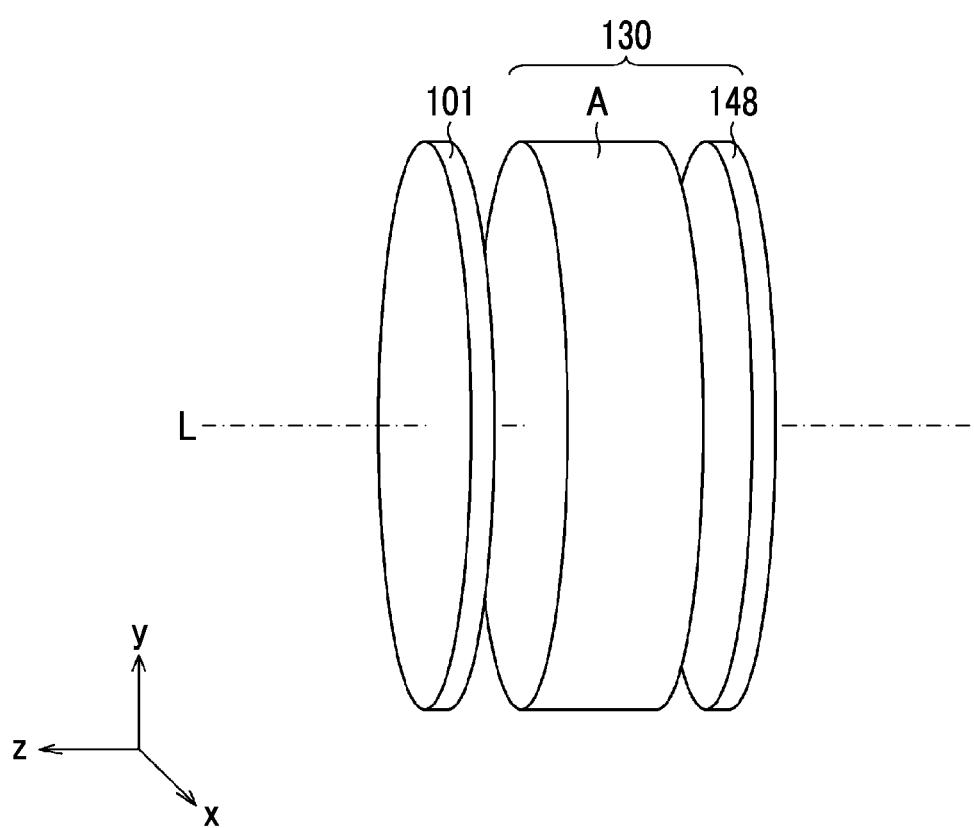
FIG. 22 is a diagram illustrating another example of a first polarizing part.

FIG. 22 is a diagram illustrating another example of the first polarizing part. In this example, a first polarizing filter 101 forming the first polarizing part is rotatably disposed in the imaging optical system 100A. The first polarizing filter 101 is disposed closer to the object side than the wavelength polarizing filter unit 130. Specifically, the first polarizing filter 101 is disposed adjacent to the object side of the intermediate filter A to be rotatable about the optical axis L.

In this case, the first polarizing filter 101 is disposed at a pupil position of the imaging optical system 100A or near the pupil position, and the first polarizing filter 101 is disposed adjacent to the object side of the intermediate filter A. Accordingly, a difference in the amount of light occurring between a portion of the aperture region close to the optical axis L and a peripheral portion of the aperture region can be suppressed.

Figure 23:
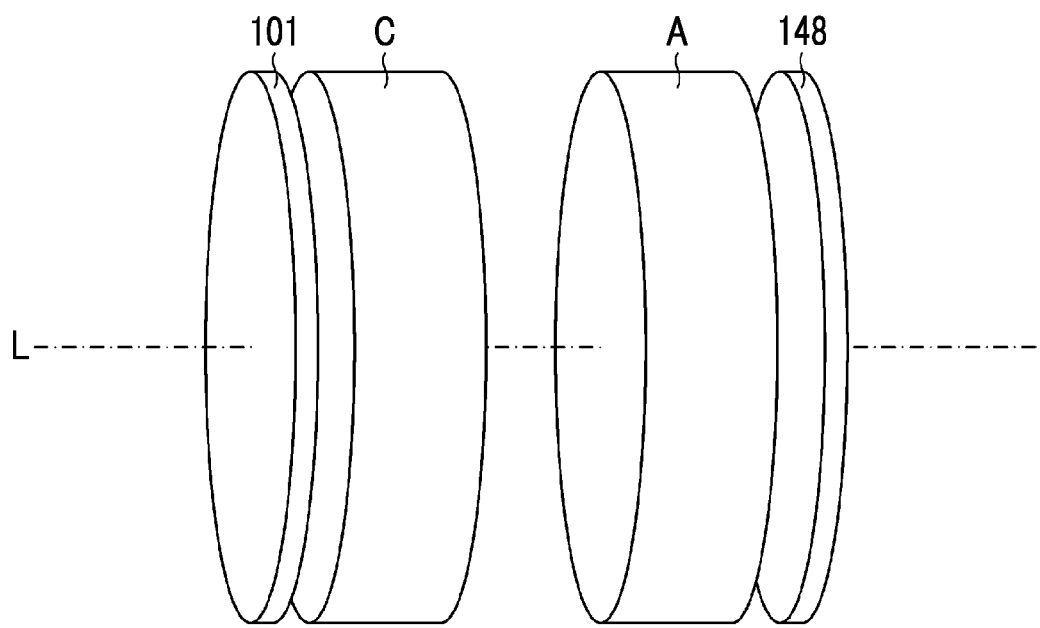
FIG. 23 is a diagram illustrating another example of the first polarizing part.

FIG. 23 is a diagram illustrating another example of the first polarizing part. In this example, the first polarizing part is formed of a first polarizing filter 101 and a liquid crystal polarization-rotation element C that is disposed on the image side of the first polarizing filter 101. The first polarizing filter 101 is fixed to transmit rays having one polarization direction. Accordingly, the rays transmitted through the first polarizing filter 101 are polarized by the liquid crystal polarization-rotation element C. Since the orientation of liquid crystal molecules of the liquid crystal polarization-rotation element C is changed in a case where an applied voltage is changed, the liquid crystal polarization-rotation element C changes the polarization directions of rays passing through the first polarizing filter 101. Accordingly, the polarization directions of the rays transmitted through the first polarizing filter 101 can be freely changed.

<Control of Polarization Direction of First Polarizing Part>

The polarization direction of the first polarizing part is controlled in the first to third embodiments as described above, so that the amounts of light in the aperture regions 132A to 132C are adjusted. Further, the polarization direction of the first polarizing part is automatically controlled or manually controlled as described below.

A case where the polarization direction of the first polarizing part is automatically controlled will be described. For example, the polarization direction of the first polarizing part is automatically controlled by a CPU that is provided in the lens device 100 or a polarization direction controller that is formed of a CPU provided in the imaging apparatus body 200. In a case where the first polarizing part is formed of the first polarizing filter 101 as described in the first embodiment, the first polarizing filter 101 is rotated by the polarization direction controller such that the amounts of light in the aperture regions 132A to 132C are adjusted. The polarization direction controller rotates the first polarizing filter 101 on the basis of a ratio between the amounts of light in the respective aperture regions 132A to 132C to control the polarization direction of the first polarizing filter 101. The polarization direction controller rotates the first polarizing filter 101 such that the balance of a ratio between the amounts of light in the respective aperture regions 132A to 132C is improved.

Next, a case where the polarization direction of the first polarizing part is manually controlled will be described. For example, the lens device 100 comprises a polarization direction restricting part that restricts the polarization direction of the first polarizing part at a predetermined position. The polarization direction restricting part is provided such that the rotation of the first polarizing filter 101 is stopped at a position where the balance of a ratio between the amounts of light in the aperture regions 132A to 132C is improved in a case where the first polarizing part is formed of the first polarizing filter 101 as described in the first embodiment and a user manually rotates the first polarizing filter 101. The polarization direction restricting part is provided such that the rotation of the first polarizing filter 101 is stopped at a position corresponding to an angle of 4° clockwise in a case where the light source 320 is a halogen lamp in the first example. Further, the polarization direction restricting part is provided such that the first polarizing filter 101 is stopped at an angle of 63° counterclockwise in a case where the light source 320 is an LED. Accordingly, in a case where a user rotates the first polarizing filter 101, the first polarizing filter 101 can be stopped at a position where the balance of a ratio between the amounts of light in the aperture regions 132A to 132C is improved.

Fourth Embodiment

Next, a fourth embodiment will be described. In the above-mentioned first to third embodiments, the first polarizing part polarizes rays transmitted through the imaging optical system 100A in various directions to adjust the amounts of light in the aperture regions 132A to 132C by interaction of the second polarizing filters 148A to 148C with the polarization directions. That is, in the first to third embodiments, the first polarizing part has been provided to be capable of changing the polarization directions of rays to be transmitted. In the fourth embodiment, a first polarizing filter 101 by which the directions of rays to be polarized are fixed is provided on a wavelength polarizing filter unit 130 instead of the first polarizing part that can change the polarization directions of rays.

Figure 24:
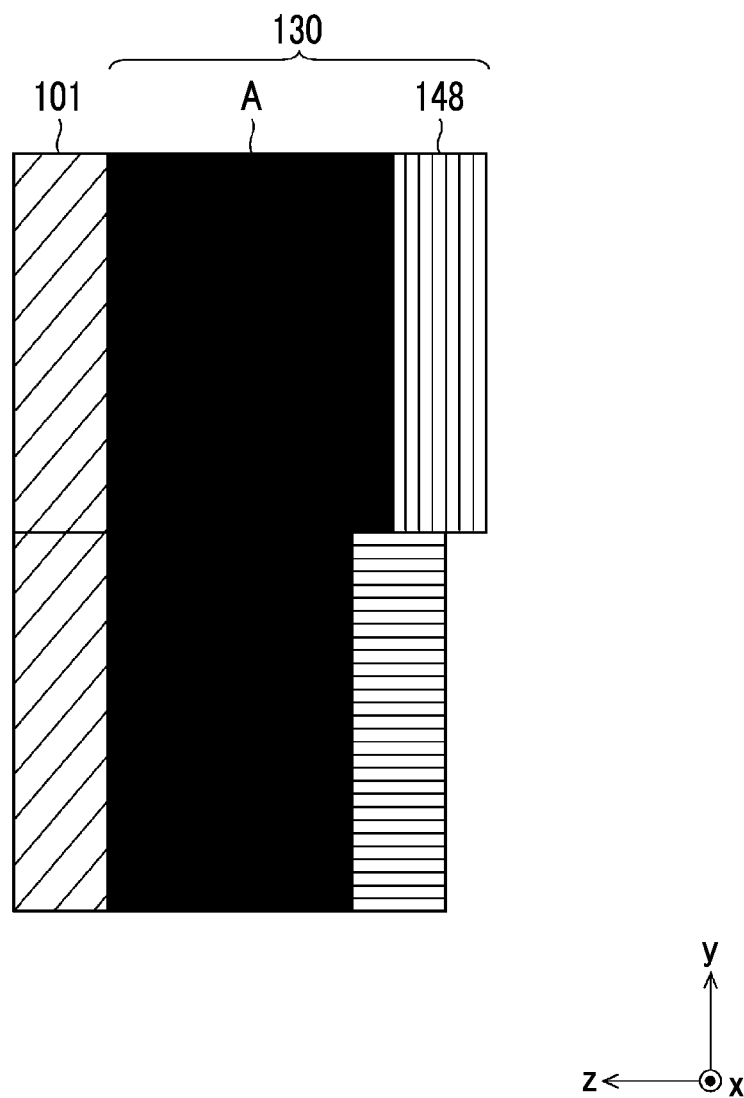
FIG. 24 is a diagram conceptually showing a first polarizing filter and a wavelength polarizing filter unit.
Figure 25:
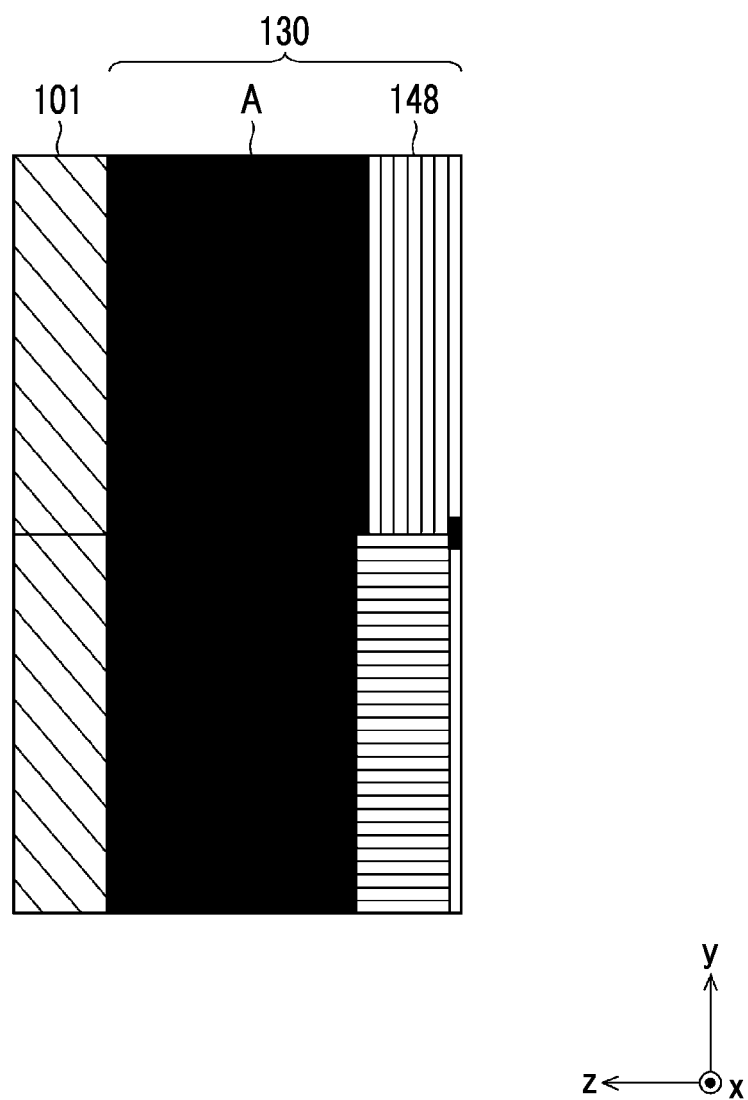
FIG. 25 is a diagram conceptually showing a first polarizing filter and a wavelength polarizing filter unit.

FIGS. 24 and 25 are diagrams conceptually showing first polarizing filters 101 and wavelength polarizing filter units 130. The first polarizing filter 101 and the wavelength polarizing filter unit 130 are integrally adhered to each other and form one optical member. Further, in the following description, the filter sets 140A to 140C will be collectively referred to as a filter set 140, the ND filters 142A to 142C will be collectively referred to as an ND filter 142, the wavelength selective filters 144A to 144C will be collectively referred to as a wavelength selective filter 144, the optical path length-correcting filters 146A to 146C will be collectively referred to as an optical path length-correcting filter 146, and the second polarizing filters 148A to 148C will be collectively referred to as a second polarizing filter 148.

The wavelength polarizing filter unit 130 of the present embodiment comprises the first polarizing filter 101 on the object side thereof. The polarization direction of the first polarizing filter 101 shown in FIG. 24 and the polarization direction of the first polarizing filter 101 shown in FIG. 25 are different from each other. On the other hand, the polarization directions of the second polarizing filters 148 shown in FIGS. 24 and 25 are the same. A plurality of optical members of which the polarization directions of the first polarizing filters 101 are changed as described above are prepared, and a ratio between the amounts of light in the aperture regions 132A to 132C can be changed in a case where the optical member is replaced. Further, since the first polarizing filter 101 is disposed closest to the object side and the second polarizing filter 148 is disposed closest to the image side in the above-mentioned optical member, the amounts of light in the aperture regions 132A to 132C are reduced and crosstalk between the aperture regions 132A to 132C is suppressed.

<Examples of Filter Set>

Next, the above-mentioned filter set 140 will be described. The disposition of the respective filters forming the filter set 140 will be described below.

First, the disposition of the second polarizing filter 148 of the filter set 140 will be described.

Figure 26:
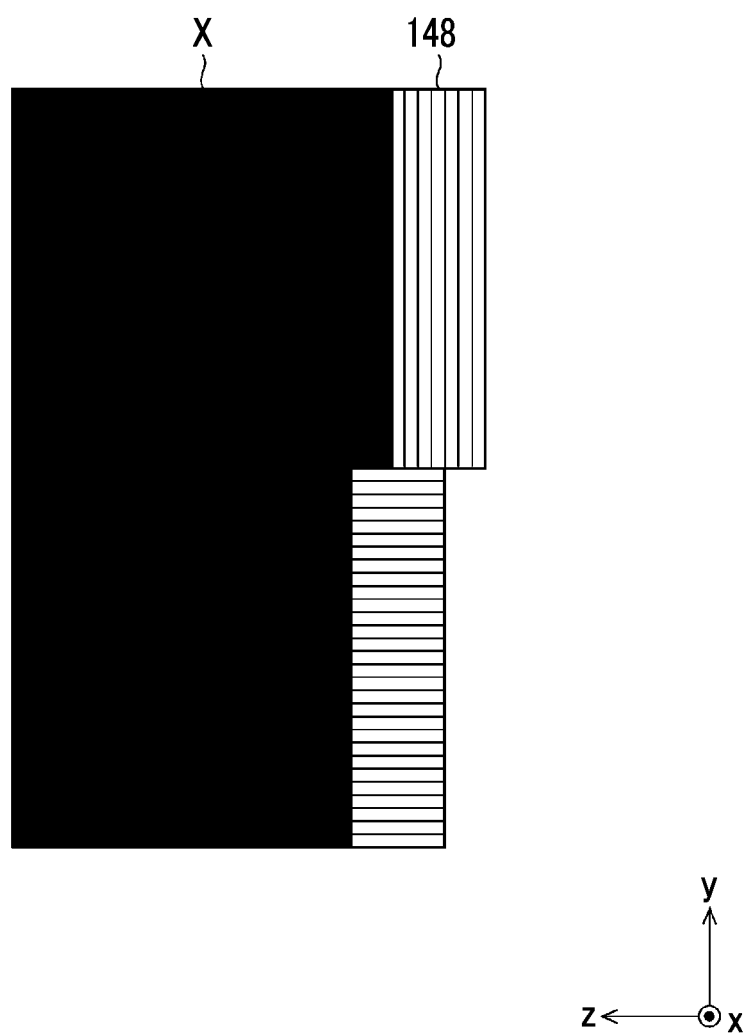
FIG. 26 is a diagram illustrating the disposition of a second polarizing filter.
Figure 27:
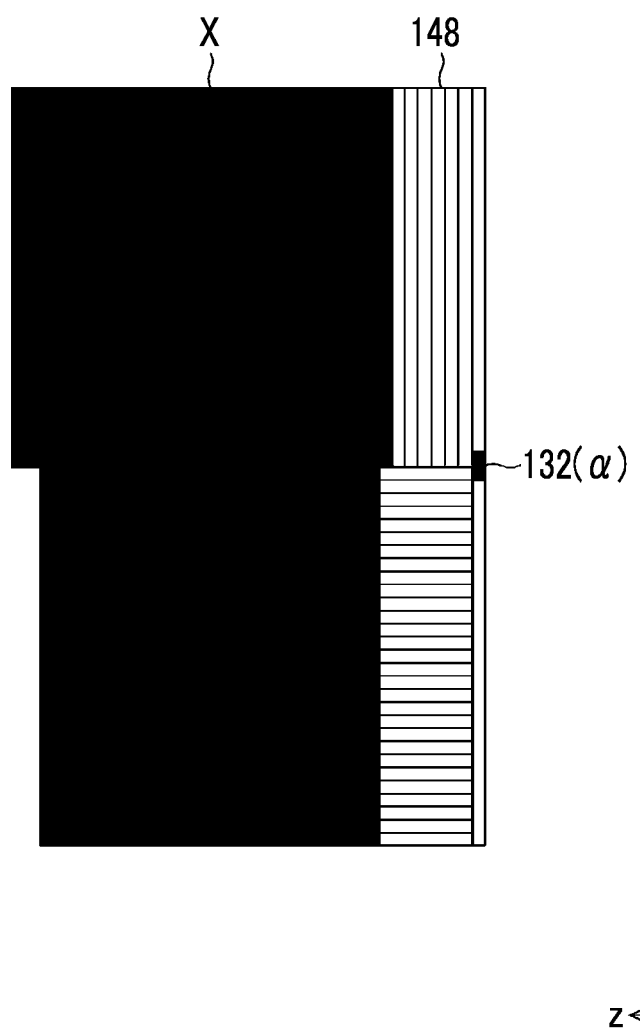
FIG. 27 is a diagram illustrating the disposition of the second polarizing filter.

FIGS. 26 and 27 are diagrams illustrating the disposition of the second polarizing filter 148. The ND filter 142, the wavelength selective filter 144, and the optical path length-correcting filter 146 are disposed in a filter denoted by Reference character X. It is preferable that the second polarizing filter 148 is disposed closest to the image side in the filter set 140 as shown in FIGS. 26 and 27. Since the second polarizing filter 148 is disposed closest to the image side in the filter set 140 as described above, polarization characteristics generated in a case where rays are transmitted through the other filters (the ND filter 142, the wavelength selective filter 144, and the optical path length-correcting filter 146) can be canceled out by the second polarizing filter 148.

Since all the filters of the filter set 140 are disposed on the object side of the frame 132 in FIG. 27, the second polarizing filter 148 is disposed on the image side of the region boundary member 132(α).

Next, the disposition of the second polarizing filter 148 and the wavelength selective filter 144 of the filter set 140 will be described.

Figure 28:
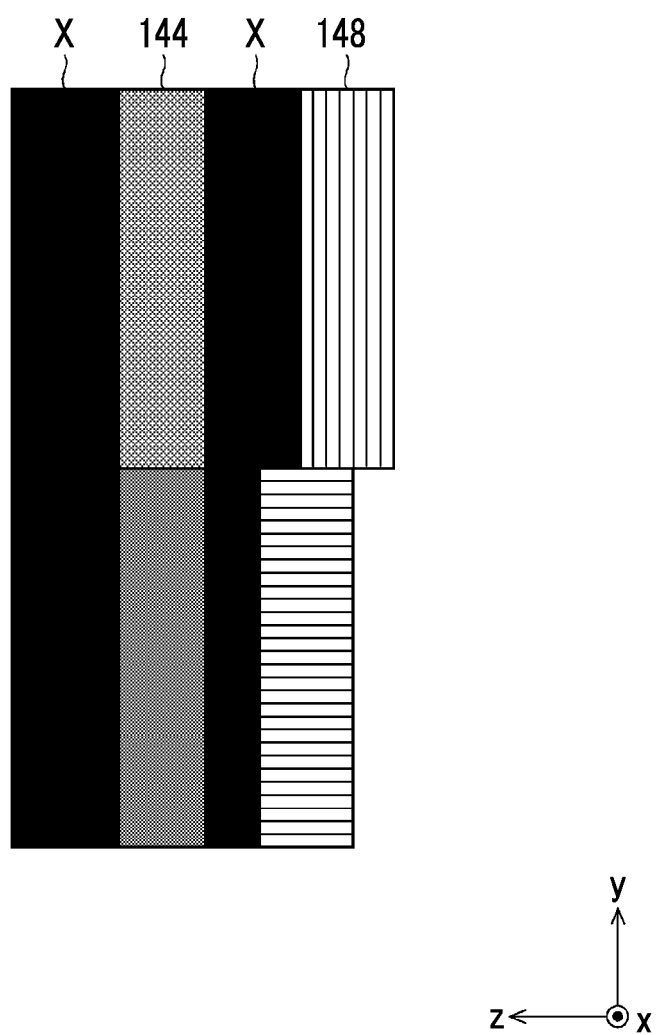
FIG. 28 is a diagram illustrating the disposition of a wavelength selective filter and the second polarizing filter.
Figure 29:
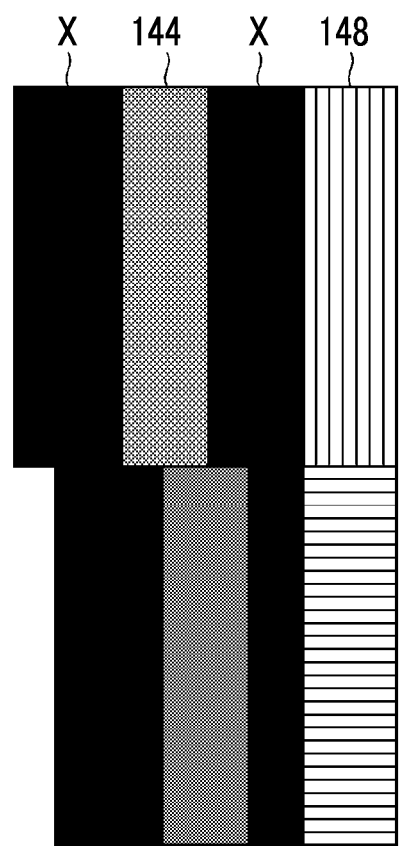
FIG. 29 is a diagram illustrating the disposition of the wavelength selective filter and the second polarizing filter.

FIGS. 28 and 29 are diagrams illustrating the disposition of the wavelength selective filter 144 and the second polarizing filter 148. The ND filter 142 and the optical path length-correcting filter 146 are disposed in a filter denoted by Reference character X. As shown in FIGS. 28 and 29, the second polarizing filter 148 is disposed closer to the image side than the wavelength selective filter 144. Since the second polarizing filter 148 is disposed closer to the image side than the wavelength selective filter 144 as described above, polarization characteristics generated in a case where rays are transmitted through the wavelength selective filter 144 can be canceled out by the second polarizing filter 148.

Next, the disposition of the ND filter 142 and the wavelength selective filter 144 of the filter set 140 will be described.

Figure 30:
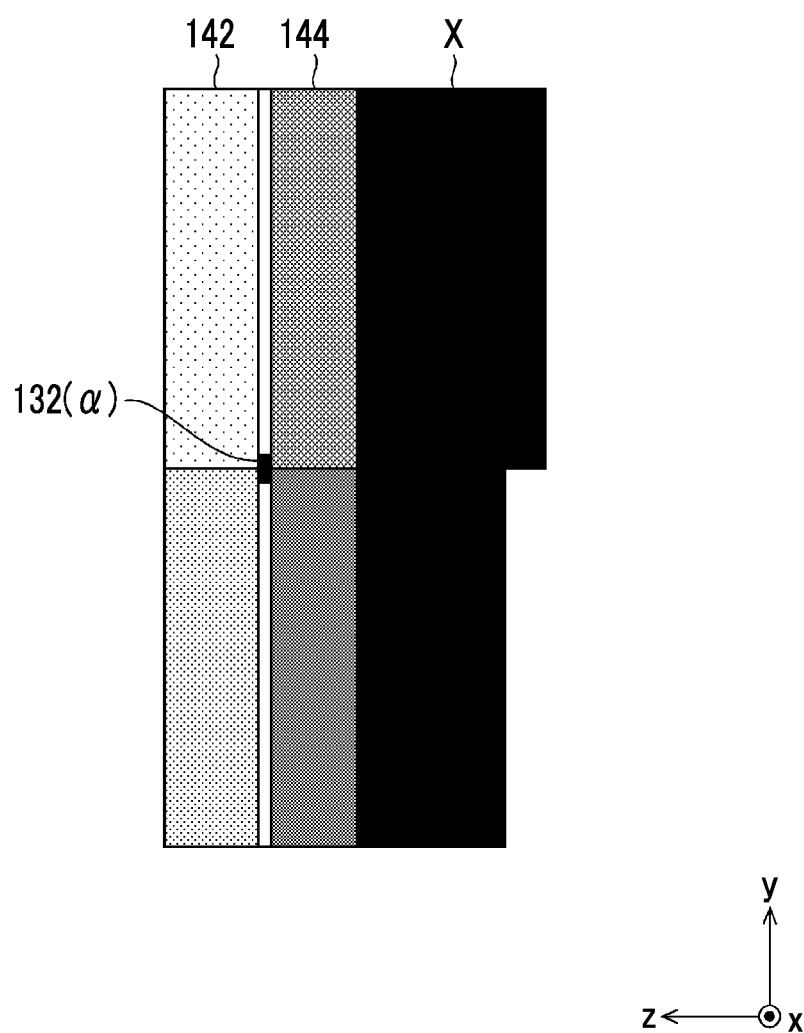
FIG. 30 is a diagram illustrating the disposition of an ND filter and the wavelength selective filter.

FIG. 30 is a diagram illustrating the disposition of the ND filter 142 and the wavelength selective filter 144. The optical path length-correcting filter 146 and the second polarizing filter 148 are disposed in a filter denoted by Reference character X. As shown in FIG. 30, the ND filter 142 is disposed closer to the object side than the wavelength selective filter 144. Accordingly, flare and a ghost caused by intense reflected light on the surface of the wavelength selective filter 144 can be suppressed.

Next, the disposition of the ND filter 142 of the filter set 140 will be described.

Figure 31:
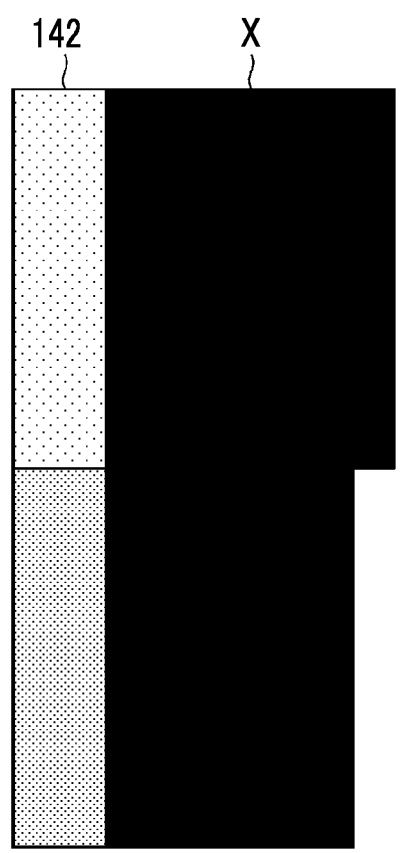
FIG. 31 is a diagram illustrating the disposition of the ND filter.
Figure 32:
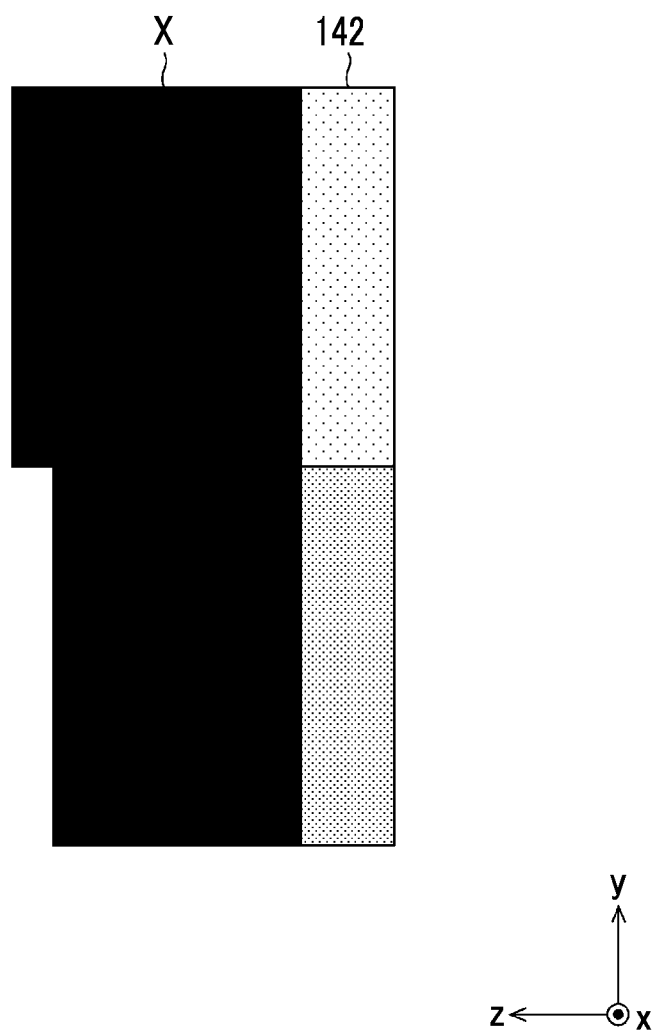
FIG. 32 is a diagram illustrating the disposition of the ND filter.

FIGS. 31 and 32 are diagrams illustrating the disposition of the ND filter 142. The wavelength selective filter 144, the optical path length-correcting filter 146, and the second polarizing filter 148 are disposed in a filter denoted by Reference character X. In FIG. 31, the ND filter 142 is disposed closest to the object side in the filter set 140. Since the ND filter 142 is disposed closest to the object side as described above, light is dimmed before being reflected by the wavelength selective filter 144. As a result, a ghost can be suppressed and adjustment can be easily performed afterwards. In FIG. 32, the ND filter 142 is disposed closest to the image side in the filter set 140. Accordingly, the ND filter 142 can be easily mounted and adjustment can be easily performed afterwards.

Next, the disposition of the optical path length-correcting filter 146 of the filter set 140 will be described.

Figure 33:
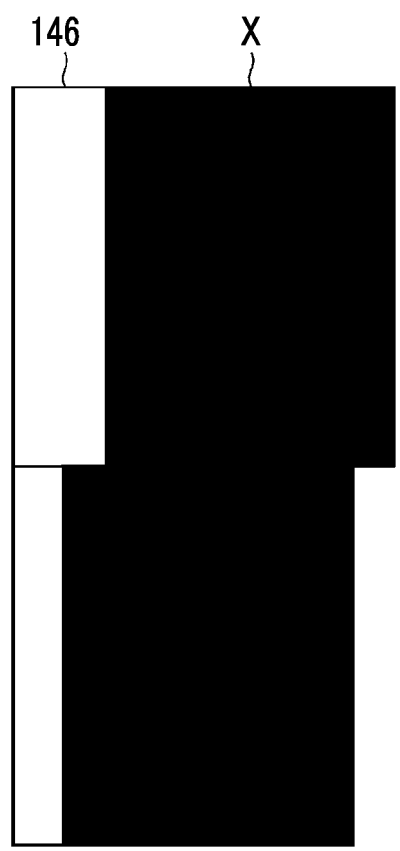
FIG. 33 is a diagram illustrating the disposition of an optical path length-correcting filter.
Figure 34:
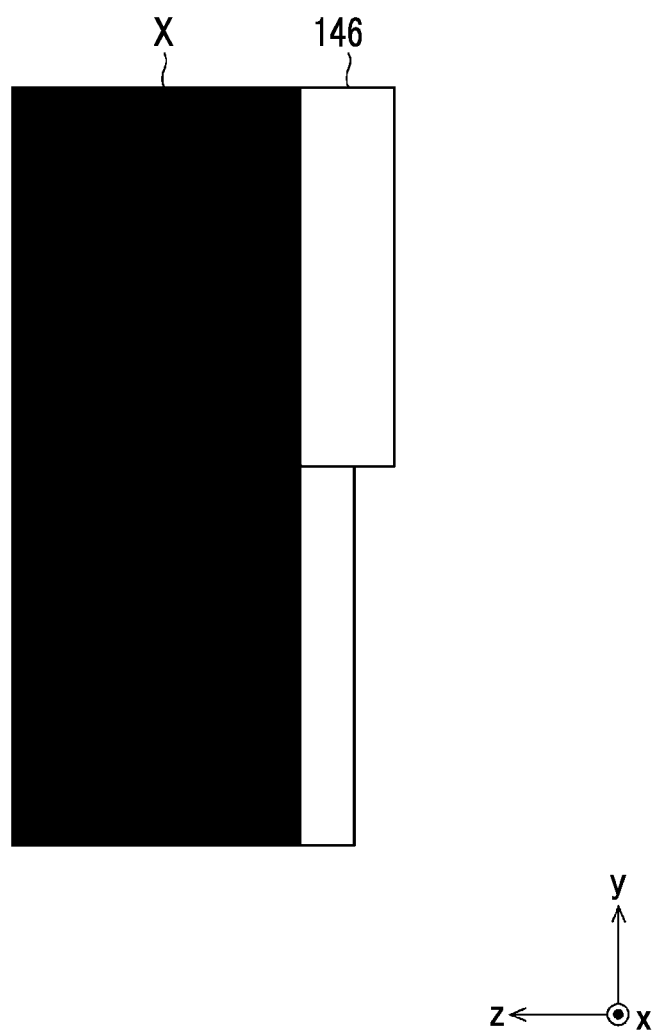
FIG. 34 is a diagram illustrating the disposition of the optical path length-correcting filter.

FIGS. 33 and 34 are diagrams illustrating the disposition of the optical path length-correcting filter 146. The ND filter 142, the wavelength selective filter 144, and the second polarizing filter 148 are disposed in a filter denoted by Reference character X. In FIG. 33, the optical path length-correcting filter 146 is disposed closest to the object side. Further, in FIG. 34, the optical path length-correcting filter 146 is disposed closest to the image side. Accordingly, the optical path length-correcting filter 146 can be easily mounted and adjustment can be easily performed afterwards.

The embodiments of the present invention have been described above, but it goes without saying that the present invention is not limited to the above-mentioned embodiments and may have various modifications without departing from the scope of the present invention.

EXPLANATION OF REFERENCES

10: imaging apparatus
100: lens device
100A: imaging optical system
100B: illumination device
101: first polarizing filter
102: lens barrel
108: slit
110: first lens
120: second lens
130: wavelength polarizing filter unit
132: frame
200: imaging apparatus body
210: imaging element
211: pixel array layer
212: photodiode
213: polarizing filter element-array layer
214A: polarizing filter element
214B: polarizing filter element
214C: polarizing filter element
214D: polarizing filter element
215: microlens array layer
216: microlens
230: signal processing unit
232: analog signal processing unit
234: Image generation unit
236: coefficient storage unit
310: light source controller
320: light source
L: optical axis

What is claimed is:

1. A lens device comprising:
an imaging optical system;
a first polarizing filter that polarizes at least a part of rays transmitted through the imaging optical system; and
a filter unit that is disposed closer to an image side than the first polarizing filter, is disposed at a pupil position of the imaging optical system or near the pupil position, and includes a plurality of aperture regions transmitting the rays of the imaging optical system and including a first aperture region and a second aperture region, a plurality of wavelength selective filters disposed in the first aperture region and the second aperture region and transmitting pieces of light of which at least a part of wavelength ranges are different from each other, and a second polarizing filter including a plurality of polarizing filters disposed in the first aperture region and the second aperture region and having polarization directions different from each other.

2. The lens device according to claim 1,
wherein a polarization direction of the first polarizing filter is variable.

3. The lens device according to claim 1,
wherein the first polarizing filter is rotated about an optical axis.

4. The lens device according to claim 1,
wherein the first polarizing filter is disposed on an object side of a lens included in the imaging optical system.

5. The lens device according to claim 1,
wherein the first polarizing filter is disposed in the imaging optical system and is disposed closer to an object side than the filter unit.

6. The lens device according to claim 1,
wherein the first polarizing filter includes a plurality of regions having polarization directions different from each other.

7. The lens device according to claim 1,
wherein the first polarizing filter includes a plurality of regions of which polarization directions are changeable independently, and the plurality of regions are rotated about rotation axes, respectively.

8. The lens device according to claim 1,
wherein the second polarizing filter is disposed on an image side of the plurality of wavelength selective filters.

9. The lens device according to claim 1,
wherein the filter unit further includes a plurality of optical path length-correcting filters that are disposed in the first aperture region and the second aperture region and correct axial chromatic aberration caused by the plurality of wavelength selective filters.

10. The lens device according to claim 1,
wherein the filter unit further includes ND filters that are disposed in the first aperture region and the second aperture region and reduce an amount of rays of the imaging optical system.

11. The lens device according to claim 1,
wherein the first polarizing filter is formed of a polarizing filter and a liquid crystal polarization-rotation element that is disposed on an image side of the polarizing filter.

12. The lens device according to claim 1, further comprising:
a polarization direction controller that controls the polarization direction of the first polarizing filter,
wherein the polarization direction controller controls the polarization direction of the first polarizing filter on the basis of a ratio between an amount of light corresponding to the first aperture region and an amount of light corresponding to the second aperture region.

13. An imaging apparatus comprising:
the lens device according to claim 1.

14. An optical member that is disposed at a pupil position of an imaging optical system or near the pupil position, comprising:
a first polarizing filter that polarizes at least a part of rays transmitted through the imaging optical system;
a plurality of aperture regions that transmit the rays of the imaging optical system and include a first aperture region and a second aperture region;
a plurality of wavelength selective filters that are disposed in the first aperture region and the second aperture region and transmit pieces of light of which at least a part of wavelength ranges are different from each other; and
a second polarizing filter that includes a plurality of polarizing filters disposed in the first aperture region and the second aperture region and having polarization directions different from each other,
wherein the first polarizing filter is disposed closest to an object side and the second polarizing filter is disposed closest to an image side.

15. An imaging apparatus comprising:
the optical member according to claim 14.

16. An optical member that is disposed at a pupil position of an imaging optical system or near the pupil position, comprising:
a plurality of aperture regions that transmit rays of the imaging optical system and include a first aperture region and a second aperture region;
ND filters that are disposed in the first aperture region and the second aperture region and reduce an amount of rays of the imaging optical system;
a plurality of wavelength selective filters that are disposed in the first aperture region and the second aperture region and transmit pieces of light of which at least a part of wavelength ranges are different from each other;
a plurality of optical path length-correcting filters that are disposed in the first aperture region and the second aperture region and correct axial chromatic aberration caused by the plurality of wavelength selective filters; and
a plurality of polarizing filters that are disposed in the first aperture region and the second aperture region and have polarization directions different from each other,
wherein the optical path length-correcting filters are disposed closer to an image side than the wavelength selective filters.

17. An imaging apparatus comprising:
the optical member according to claim 16; and
a first polarizing filter that polarizes at least a part of rays transmitted through the imaging optical system.

* * * * *